(12) United States Patent
Tanaka et al.

(10) Patent No.: US 7,608,527 B2
(45) Date of Patent: Oct. 27, 2009

(54) LASER IRRADIATION METHOD AND METHOD FOR MANUFACTURING CRYSTALLINE SEMICONDUCTOR FILM

(75) Inventors: Koichiro Tanaka, Isehara (JP); Yoshiaki Yamamoto, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 565 days.

(21) Appl. No.: 11/017,900

(22) Filed: Dec. 22, 2004

(65) Prior Publication Data

US 2005/0139786 A1   Jun. 30, 2005

(30) Foreign Application Priority Data

Dec. 26, 2003   (JP)   ............................. 2003-432504

(51) Int. Cl.
    *H01L 21/20* (2006.01)
    *H01L 21/36* (2006.01)

(52) U.S. Cl. ................... 438/487; 438/166; 438/795; 257/E21.324; 257/E21.475

(58) Field of Classification Search .............. 438/166, 438/795, 487; 257/E21.324, E21.475
See application file for complete search history.

(56) References Cited

U.S. PATENT DOCUMENTS

| | | | |
|---|---|---|---|
| 4,845,354 A | 7/1989 | Gupta et al. | |
| 5,272,708 A | 12/1993 | Esterowitz et al. | |
| 5,450,230 A | 9/1995 | Masuda et al. | |
| 5,654,998 A | 8/1997 | Turcu et al. | |
| 5,936,726 A | 8/1999 | Takeda et al. | |
| 6,037,967 A | 3/2000 | Allen et al. | |
| 6,242,292 B1 * | 6/2001 | Yamazaki et al. | 438/166 |
| 6,368,945 B1 | 4/2002 | Im | |
| 6,407,431 B2 | 6/2002 | Yamazaki et al. | |
| 6,483,858 B1 | 11/2002 | Hovater et al. | |
| 6,549,547 B2 | 4/2003 | Galvanauskas et al. | |
| 6,574,250 B2 | 6/2003 | Sun et al. | |
| 6,618,423 B1 | 9/2003 | Dekorsy et al. | |
| 6,760,356 B2 | 7/2004 | Erbert et al. | |
| 6,764,886 B2 | 7/2004 | Yamazaki et al. | |

(Continued)

FOREIGN PATENT DOCUMENTS

EP   1 537 938   6/2005

(Continued)

OTHER PUBLICATIONS

Choi. T et al., "Ultrafast Laser-Induced Crystallization of Amorphous Silicon Films.", Optical Engineering, Nov. 1, 2003, vol. 42, No. 11, pp. 3383-3388, Society of Photo-Optical Instrumentation Engineers.

(Continued)

*Primary Examiner*—Alexander G Ghyka
*Assistant Examiner*—Seahvosh J Nikmanesh
(74) *Attorney, Agent, or Firm*—Eric J. Robinson; Robinson Intellectual Property Law Office, P.C.

(57) ABSTRACT

Even when the laser irradiation is performed under the same condition with the energy distribution of the beam spot shaped as appropriate, the energy given to the irradiated surface is not yet homogeneous. When a semiconductor film is crystallized to form a crystalline semiconductor film using such inhomogeneous irradiation energy, the crystallinity becomes inhomogeneous in this film, and the characteristic of semiconductor elements manufactured using this film varies. In the present invention, an irradiated object formed over a substrate is irradiated with a laser beam having the pulse width that is an order of picosecond ($10^{-12}$ second) or less.

42 Claims, 9 Drawing Sheets

U.S. PATENT DOCUMENTS

| | | | |
|---|---|---|---|
| 6,778,565 | B2 | 8/2004 | Spuehler et al. |
| 6,908,797 | B2 | 6/2005 | Takano |
| 6,958,853 | B1 | 10/2005 | Arnone et al. |
| 7,112,760 | B2 | 9/2006 | Ishikawa et al. |
| 7,279,372 | B2 | 10/2007 | Yamazaki et al. |
| 2002/0094008 | A1 | 7/2002 | Tanaka |
| 2003/0031214 | A1 | 2/2003 | Tanaka et al. |
| 2003/0058904 | A1 | 3/2003 | Krainer et al. |
| 2003/0102290 | A1 | 6/2003 | Shaffer |
| 2003/0235971 | A1 | 12/2003 | Yamazaki et al. |
| 2004/0053480 | A1* | 3/2004 | Tanabe et al. ............... 438/487 |
| 2004/0058501 | A1 | 3/2004 | Maiz et al. |
| 2004/0069751 | A1 | 4/2004 | Yamazaki et al. |
| 2004/0074881 | A1 | 4/2004 | Oishi |
| 2004/0209410 | A1 | 10/2004 | Tanaka |
| 2005/0036190 | A1 | 2/2005 | Tanaka |
| 2005/0037552 | A1 | 2/2005 | Yamazaki et al. |
| 2005/0115930 | A1 | 6/2005 | Tanaka et al. |
| 2005/0139582 | A1 | 6/2005 | Tanaka |
| 2005/0139786 | A1 | 6/2005 | Tanaka et al. |
| 2006/0079041 | A1 | 4/2006 | Yamazaki et al. |

FOREIGN PATENT DOCUMENTS

| | | |
|---|---|---|
| JP | 62-259437 | 11/1987 |
| JP | 06-201333 | 7/1994 |
| JP | 06-320292 | 11/1994 |
| JP | 10-153746 | 6/1998 |
| JP | 2003-086507 | 3/2003 |
| WO | 1998/02745 | 6/1998 |
| WO | 2003/028177 | 4/2003 |

OTHER PUBLICATIONS

Office Action (U.S. Appl. No. 11/017,899; US7006 (U08066)) Dated Nov. 13, 2007.

Office Action (U.S. Appl. No. 10/997,868; US7532 (U07964)) Dated Dec. 6, 2007.

Office Action (U.S. Appl. No. 11/017,899) Dated Jul. 7, 2008.

Office Action (U.S. Appl. No. 10/997,868) Dated May 2, 2008.

Ohyama, H. et al., "Free Electron Laser Annealing of Silicon Carbide," Journal of Electronic Materials, Mar. 1997, vol. 26, No. 3, pp. 183-186.

Search Report (Application No. 04029713.7) Dated Dec. 19, 2008.

Ohyama, H. et al., "Free Electron Laser Annealing of Silicon Carbide," Database Inspec [Online], The Institution of Electrical Engineers, Stevenage, GB, Mar. 1997, XP002505532, Database Accession No. 5581060, 1 page Abstract:.

Search Report (Application No. 04027765.9) dated Jan. 16, 2009.

* cited by examiner switching TFT   driving TFT driving circuit portion   pixel portion scanning direction of laser beam scanning direction of laser beam scanning direction of laser beam

LASER IRRADIATION METHOD AND METHOD FOR MANUFACTURING CRYSTALLINE SEMICONDUCTOR FILM

BACKGROUND OF THE INVENTION

1. Field of the Invention

The present invention relates to a laser irradiation method and particularly relates to a laser irradiation method being able to perform homogeneous annealing to an irradiated object. Moreover, the present invention relates to a method for manufacturing a crystalline semiconductor film and particularly relates to a method for manufacturing a crystalline semiconductor film having less variation of the crystallinity with high throughput.

2. Related Art

It is important to select a beam profile of a linear beam properly in order to give laser energy homogeneously to the irradiated object in a laser annealing process.

Since a beam spot of a laser beam emitted from a laser oscillator originally has wide energy distribution, the laser irradiation intensity is inhomogeneous according to the location in the irradiated object when the irradiated object is irradiated with the beam spot directly from the laser oscillator.

Consequently, a method has been employed in which an optical system including one or a plurality of cylindrical lens arrays is used to divide a beam spot and to superpose the divided beam spots so that the energy distribution of the beam spot is homogenized. Moreover, another method is suggested in which one or a plurality of cylindrical lenses is used in addition to the above optical system so as to form a linear beam having homogeneous energy distribution (refer to patent document 1).

When the laser annealing is performed using the beam spot having such homogeneous energy distribution, the irradiated object can be annealed homogeneously. [Patent document 1] Japanese Patent Laid-Open No. H10-153746.

However, even when the laser irradiation is performed under the same condition after adjusting the energy distribution of the beam spot as appropriate, the energy given to the irradiated object is not homogeneous yet. When a semiconductor film is crystallized to form a crystalline semiconductor film using such inhomogeneous irradiation energy, the crystallinity in the crystalline semiconductor film becomes inhomogeneous. As a result, when semiconductor elements are formed using this crystalline semiconductor film, their characteristics vary between the semiconductor elements.

SUMMARY OF THE INVENTION

Consequently, the present invention is made in view of the above problem, and it is an object of the present invention to provide a laser irradiation method that can suppress the inhomogeneity of the irradiation energy on the irradiated surface.

Moreover, it is another object of the present invention to provide a method for manufacturing a crystalline semiconductor film whose crystallinity is more homogeneous.

The present invention discloses a laser irradiation method comprises irradiating an irradiated object formed over a substrate having a refractive index n and a thickness d with a laser beam emitted from a pulsed laser oscillator, and the laser beam has a pulse width t that satisfies an inequality $ct<2nd$ where c is a speed of light in vacuum.

The present invention discloses another laser irradiation method comprises irradiating an irradiated object formed over a substrate having a refractive index n and a thickness d with a laser beam emitted from a pulsed laser oscillator, wherein wavelength of the laser beam is converted by a non-linear optical element, and the laser beam has a pulse width t that satisfies an inequality $ct<2nd$ where c is a speed of light in vacuum.

The present invention discloses another laser irradiation method comprises irradiating an irradiated object formed over a substrate having a refractive index n and a thickness d with a laser beam emitted from a pulsed laser oscillator, and the laser beam has a pulse width t that satisfies an inequality $ct<4nd$ where c is a speed of light in vacuum.

The present invention discloses another laser irradiation method comprises irradiating an irradiated object formed over a substrate having a refractive index n and a thickness d with a laser beam emitted from a pulsed laser oscillator, wavelength of the laser beam is converted by a non-linear optical element, and the laser beam has a pulse width t that satisfies an inequality $ct<4nd$ where c is a speed of light in vacuum.

The present invention discloses another laser irradiation method comprises irradiating an irradiated object formed over a substrate having a refractive index n and a thickness d with a laser beam emitted from a pulsed laser oscillator, wavelength of the laser beam is converted by a non-linear optical element, and one point in the irradiated object is irradiated simultaneously with both a primary beam incident into the irradiated object and a secondary beam reflected on a rear surface of the substrate for a time corresponding to 10% or less of a pulse width of the laser beam.

The present invention discloses a method for manufacturing a crystalline semiconductor film comprises forming an amorphous semiconductor film over a substrate having a refractive index n and a thickness d, irradiating the amorphous semiconductor film with a laser beam emitted from a pulsed laser oscillator to form a crystalline semiconductor film, and a pulse width t of the laser beam satisfies an inequality $ct<2nd$ where c is a speed of light in vacuum.

The present invention discloses another method for manufacturing a crystalline semiconductor film comprises forming an amorphous semiconductor film over a substrate having a refractive index n and a thickness d, and irradiating the amorphous semiconductor film with a laser beam emitted from a pulsed laser oscillator to form a crystalline semiconductor film, and a pulse width t of the laser beam satisfies an inequality $ct<4nd$ where c is a speed of light in vacuum.

The present invention discloses another method for manufacturing a crystalline semiconductor film comprises forming an amorphous semiconductor film over a substrate having a refractive index n and a thickness d, and irradiating the amorphous semiconductor film with a laser beam emitted from a pulsed laser oscillator to form a crystalline semiconductor film, and one point in the amorphous semiconductor film is irradiated simultaneously with both a primary beam incident into the irradiated object and a secondary beam reflected on a rear surface of the substrate for a time corresponding to 10% or less of a pulse width of the laser beam.

The present invention discloses another method for manufacturing a crystalline semiconductor film comprises irradiating a crystalline semiconductor film formed over a substrate having a refractive index n and a thickness d with a laser beam emitted from a pulsed laser oscillator so as to improve crystallinity of the crystalline semiconductor film, and a pulse width t of the laser beam satisfies an inequality $ct<2nd$ where c is a speed of light in vacuum.

The present invention discloses another method for manufacturing a crystalline semiconductor film comprises irradiating a crystalline semiconductor film formed over a substrate having a refractive index n and a thickness d with a laser beam emitted from a pulsed laser oscillator so as to improve crystallinity of the crystalline semiconductor film, and a pulse width t of the laser beam satisfies an inequality ct<4nd where c is a speed of light in vacuum.

The present invention discloses another method for manufacturing a crystalline semiconductor film comprises irradiating a crystalline semiconductor film formed over a substrate having a refractive index n and a thickness d with a laser beam emitted from a pulsed laser oscillator, and one point in the crystalline semiconductor film is irradiated simultaneously with both a primary beam incident into the crystalline semiconductor film and a secondary beam reflected on a rear surface of the substrate for a time corresponding to 10% or less of a pulse width of the laser beam.

The method for manufacturing a crystalline semiconductor film of the present invention can be applied to manufacture an integrated circuit and a semiconductor display device. As the semiconductor display device, there are a liquid crystal display device, a light-emitting display device with a light-emitting element typified by an organic light-emitting element equipped in each pixel, a DMD (Digital Micromirror Device), a PDP (Plasma Display Panel), an FED (Field Emission Display), and the like.

By using the laser irradiation method of the present invention, more homogeneous laser irradiation can be performed to the irradiated object.

When the method for manufacturing a crystalline semiconductor film of the present invention is applied to manufacture a crystalline semiconductor film, it is possible to crystallize the irradiated object homogeneously at high throughput and therefore to obtain a crystalline semiconductor film having superior characteristic. Moreover, when semiconductor elements are manufactured using the crystalline semiconductor film that is crystallized by the present invention, the variation of the characteristic can be reduced between the semiconductor elements.

BRIEF DESCRIPTION OF THE INVENTION

DETAILED DESCRIPTION OF THE INVENTION

Figure 1:
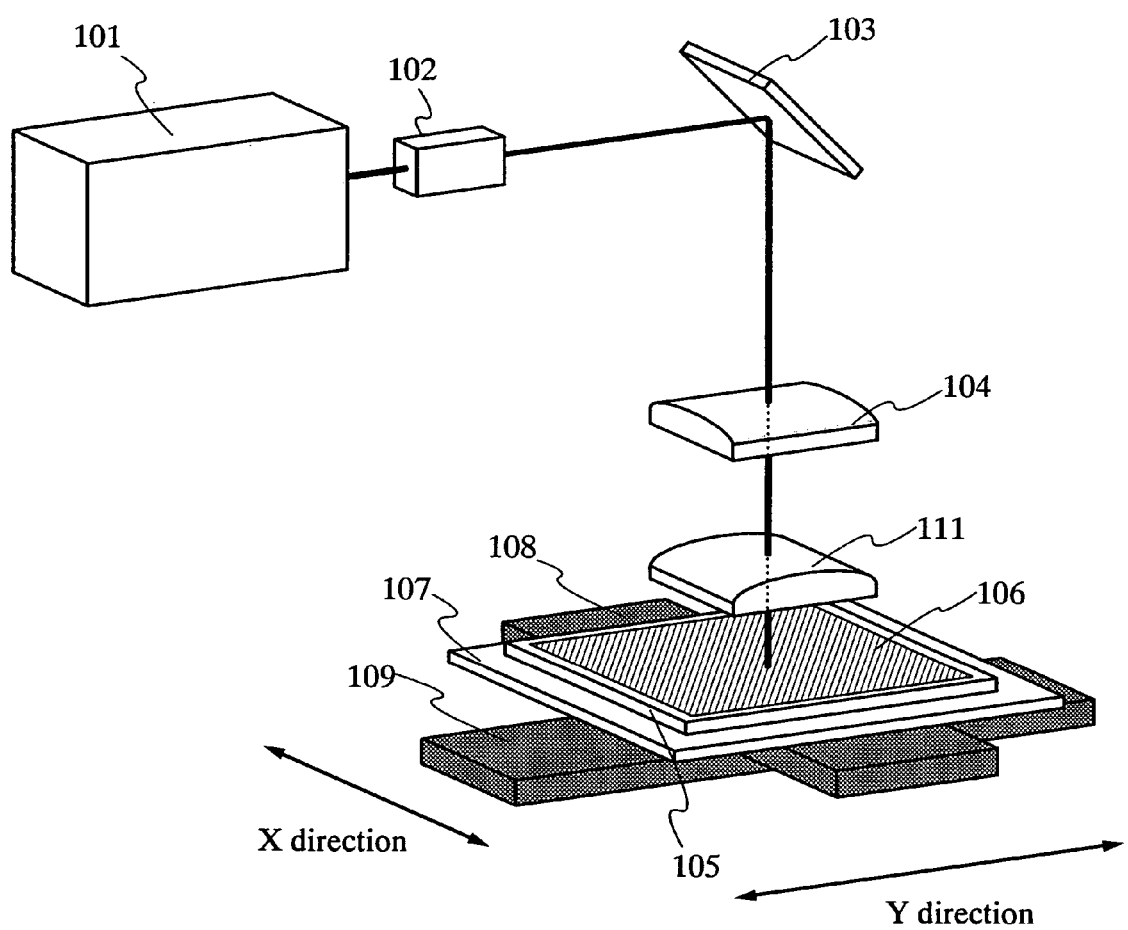
FIG. 1 is a drawing of a laser irradiation apparatus of the present invention.

An embodiment mode and embodiments of the present invention are hereinafter explained. However, since the present invention can be embodied in many different modes, it is easily understood by those skilled in the art that the modes and the details of the present invention can be changed and modified in various ways unless such changes and modifications depart from the scope and the content of the present invention hereinafter defined. Thus, the present invention is not limited to the description of the embodiment mode and the embodiments.

In the present embodiment mode, a laser beam having an ultrashort pulse width that is an order of picosecond ($10^{-12}$ second) or less is used to irradiate the irradiated object provided or formed over a substrate.

This laser irradiation method makes it possible to homogenize the intensity of the energy given to the irradiated surface.

The reason why the above structure can solve the problem is as follows.

The present inventors consider that the inhomogeneous irradiation energy on the irradiated surface is caused by the interference between the laser beam (a primary beam) irradiated directly to the irradiated object and the laser beam (a secondary beam) incident into the irradiated object again after reflecting on a rear surface of the substrate. Moreover, the present inventors consider that the interference occurs due to the distortion and the convexoconcave of the substrate.

When the laser beam, which is an electromagnetic wave having a certain wavelength, is irradiated to the irradiated object, the laser beam is absorbed in the irradiated object and the heat is generated in the part that is irradiated with the laser beam. The laser annealing is performed using this heat. It is noted that a material has its own absorption coefficient. When an electromagnetic wave having a certain wavelength is irradiated to the material that is comparatively thin and that has comparatively low absorption coefficient, the laser beam not absorbed in the irradiated object may transmit through the irradiated object.

For example, in the case where an amorphous silicon film formed over a glass substrate is irradiated with a second harmonic (wavelength 532 nm) of a Nd: YAG laser, most of the laser beam is absorbed in the amorphous silicon film when the film thickness of the amorphous silicon film is 200 nm or more. However, when the film thickness is less than 200 nm, the laser beam not absorbed in the amorphous silicon film transmits therethrough. A part of the transmitted laser beam is reflected on a front surface of the glass substrate, and another part of the laser beam is reflected on a rear surface of the glass substrate and is incident into the amorphous silicon film again. When the glass substrate has a minute distortion and a minute convexoconcave, the angle of the secondary beam reflected on the part having the distortion or the convexoconcave is changed. As a result, the optical length of the secondary beam from the rear surface of the glass substrate to the front surface of the glass substrate changes in accordance with the changed angle. When the secondary beam interferes with the primary beam that is irradiated directly, a region where the beams always intensify each other and a region where the beams are always attenuated each other are formed. In other words, standing wave is formed on the silicon film and this distribution is recorded on the silicon film.

At present, a glass substrate used as the substrate in the thin film semiconductor device such as a flat panel display has a thickness of approximately 1000 lm, and a glass substrate having a thickness of approximately 700 μm is often used. The thickness of 700 μm is 1000 times greater than the wavelength (herein 532 nm). It is very difficult to control the thickness of the substrate at the accuracy of 1/1000 of the thickness of the substrate, and it is obvious that the minute distortion and the minute convexoconcave described above exist.

Consequently, in the present invention, a pulse width is set to an order of picosecond ($10^{-12}$ second) or less so that the time for which a primary beam exists in the irradiated object simultaneously with a secondary beam reflected on a rear surface of the substrate causing the interference is short or so that the primary beam and the secondary beam don't exist in the irradiated object simultaneously. With this structure, the ratio of the time for which the interference occurs with respect to the time for which the laser is irradiated to the irradiated surface is decreased in order to suppress the effect due to the interference or is made to be zero in order to prevent the interference completely.

The principle of the present invention is explained simply as showing an example to which the present invention can be applied. Since the laser beam is an electromagnetic wave, it is considered that the speed of the laser beam is the same as that of the light (approximately 300,000 km/s). When the pulse width is set to 10 ps as shown in the present invention, the beam travels approximately 3 mm after the pulsed laser beam starts to be emitted until the emission is completed (for 10 ps). In other words, it can be said that the laser beam having a travel distance of 3 mm is emitted for one pulse.

When a laser beam having a travel distance of 3 mm and a pulse width of 10 ps is irradiated to the irradiated object formed over a substrate having a thickness of approximately 700 μm, the time for which the interference occurs between the primary beam to be irradiated directly and the secondary beam reflected on the rear surface of the substrate is approximately 50% of the irradiation time. Moreover, when the pulse width is made as short as approximately 5 ps, the interference can be avoided perfectly. This can suppress the interference due to the reflection of the laser beam transmitted through the irradiated object.

On the other hand, the laser beam used in the conventional laser annealing has a pulse width from several tens to several hundred ns. Therefore, the laser beam travels 3 to 100 m while one pulsed laser beam is emitted. In other words, it can be said that a laser beam having the travel distance from 3 to 100 m is emitted for one pulse.

When the laser beam having a travel distance of 3 m and a pulse width of 10 ns is used to irradiate the irradiated object formed over a substrate having a thickness of approximately 700 μm, it can be said from the calculation that the laser beams interfere in the irradiated object for 99.5% of the net irradiation time. In other words, when the pulse width is changed from 10 ns into 10 ps, the inhomogeneous irradiation due to the interference can be reduced to be approximately a half according to the calculation. When the pulse width is 5 ps, the interference due to the above structure does not occur according to the calculation.

The above explanation is made on the broad concept of the present invention, and further explanation is hereinafter made specifically. When the light travels in a certain medium, the refractive index of the medium affects the speed of the light. For example, when the light traveling in the air having a refractive index of 1 is incident into a glass having a refractive index of 1.5, the speed of light becomes 1/1.5. In consideration of this fact, in order that the secondary beam reflected on the rear surface of the substrate having a refractive index n and a thickness d does not cause the interference, the pulse width t may satisfy the inequality below where c is the speed of light in vacuum.

$$ct < 2nd \qquad \text{[inequality 1]}$$

According to the inequality 1, it is understood that when an amorphous silicon film formed over a substrate having a thickness d of 0.7 mm and a refractive index of 1.5 is crystallized, a pulse width t that does not cause the interference at all is approximately 7 ps or less. It is noted that the speed of light in vacuum is 300,000 km/s in the calculation.

When the laser beam having the pulse width that satisfies the above inequality 1 is used for the laser crystallization and the laser annealing, it is possible to prevent the interference due to the reflection from the rear surface of the substrate and to homogenize the irradiation energy on the irradiated surface even though the laser beam is incident vertically into the irradiated object.

In the case where the amorphous semiconductor film is crystallized by the laser irradiation to form a poly-crystalline semiconductor film, when the power of the laser beam fluctuates widely, the crystallization is not performed homogeneously. Therefore, when TFTs are manufactured using the poly-crystalline semiconductor film as an active layer, the characteristic such as on-current or mobility varies between the TFTs. Since the laser beam fluctuates temporally for ±1% even though the laser beam does not interfere, it is considered that the spatial light and shade of the luminance due to the interference can be prevented from being visible in the pixel portion by suppressing the interference to such a degree that the spatial fluctuation of the power becomes less than ±1% when forming the TFT used for the pixel portion of the semiconductor display device.

On the other hand, in the case of irradiating an amorphous semiconductor film formed over a glass substrate with a laser beam having a second harmonic, it is considered that a half of the laser beam is reflected on a front surface of the amorphous semiconductor film and that the other half thereof goes into the amorphous semiconductor film. Since the semiconductor film used as an active layer of the TFT in the semiconductor display device has a thickness of approximately several tens nm, it is considered that a half of the laser beam among the laser beam going into the amorphous semiconductor film is absorbed in the amorphous semiconductor film and that the other half thereof goes into the glass substrate in consideration of the absorption coefficient of the amorphous semiconductor film. Then, 4% of the laser beam going into the glass substrate is reflected on a rear surface of the glass substrate and goes into the amorphous semiconductor film again. Therefore, the ratio of the light returned to the amorphous semiconductor film after reflecting on the rear surface of the glass substrate with respect to the light incident into the amorphous semiconductor film from the laser oscillator is approximately 2%. When these light interfere, the power fluctuates for ±2%.

Therefore, in order to suppress the interference to such a degree that spatial fluctuation of the power is less than ±1%, the time for which the light interferes may be made shorter than a half of the pulse width t. It is more preferable that the time for which the one point in the amorphous semiconductor film is irradiated simultaneously with the two laser beams is 10% or less of the pulse width. In the case of making the time for which the laser beams interfere shorter than a half of the pulse width t, it is understood from the inequality 1 that the pulse width t of the laser beam may satisfy an inequality 2.

$$ct < 4nd \qquad \text{[inequality 2]}$$

The proper pulse width t of the laser beam changes according to the circumstances. When the proper time for which the laser beams interfere is X [%] or less of the pulse width, the pulse width t may satisfy an inequality 3.

$$(100-X)ct/100 < 2nd \qquad \text{[inequality 3]}$$

Figure 7A:
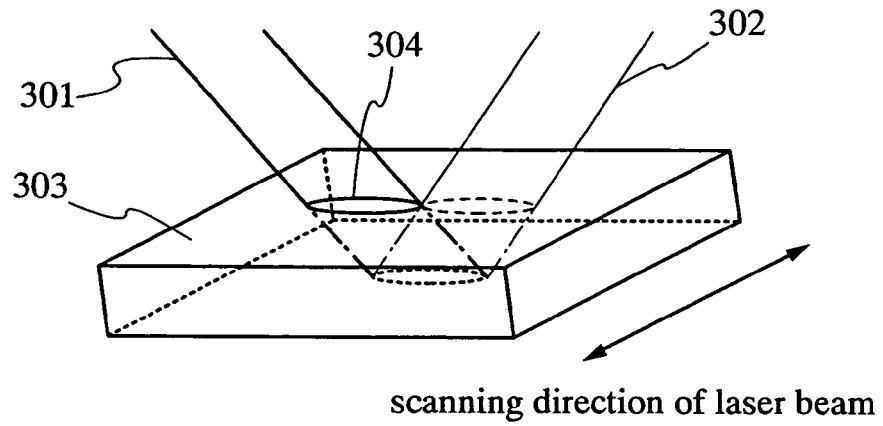
FIGS. 7A to 7C are drawings for showing conventional methods for preventing the interference.
Figure 7B:
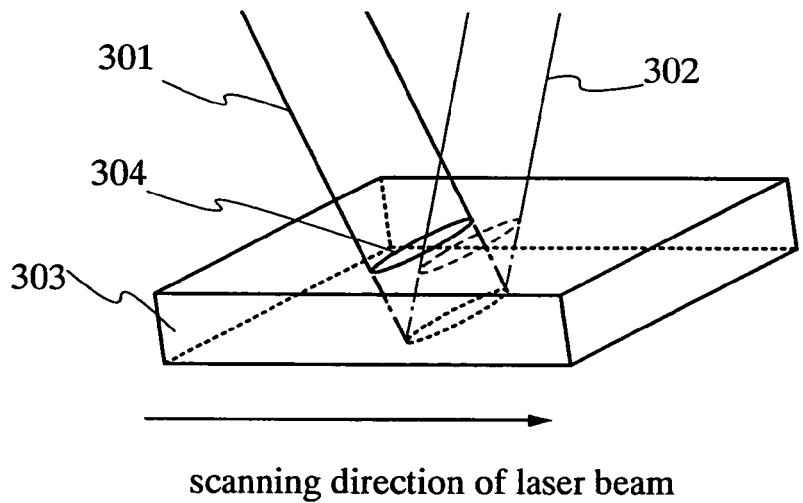
Figure 7C:
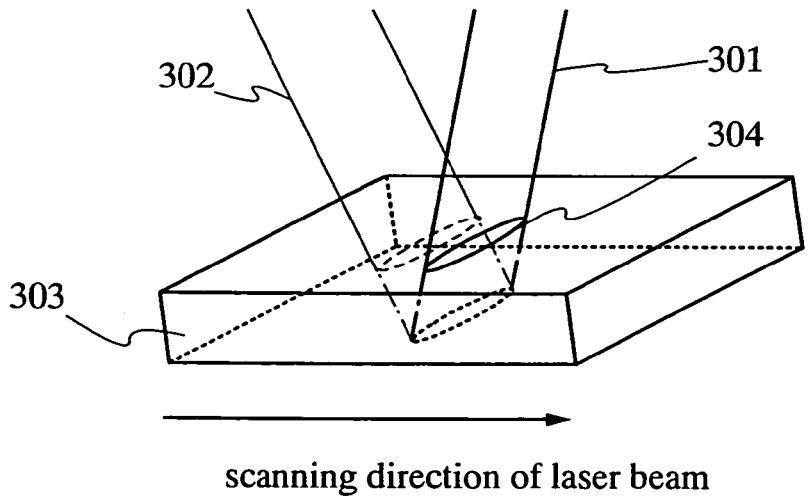

In order to solve the problem of the interference, there is a method in which the laser beam is made incident obliquely so that the primary beam does not overlap the secondary beam in the semiconductor film. FIGS. 7A to 7C show the beam spots of the primary beam and the secondary beam on the irradiated surface in the case where the interference is prevented by the oblique incidence.

In FIG. 7A, a primary beam 301 is incident at an angle in a direction of the major axis of the beam spot so that the primary beam 301 and a secondary beam 302 reflected on the rear surface of the substrate don't overlap in the semiconductor film. As shown in the figure, since it is necessary to have such a large incidence angle in the direction of the major axis of the beam spot in order that the primary beam 301 and the secondary beam 302 don't overlap, a beam spot 304 is difficult to be transformed into a desired shape. In FIGS. 7B and 7C, the primary beam 301 is incident at an angle in a direction of the minor axis of the beam spot so that the primary beam 301 and the secondary beam 302 reflected on the rear surface of the substrate don't overlap in the semiconductor film. In this case, although the incidence angle is not as large as that in FIG. 7A, the irradiation condition is different according to the scanning direction as shown in FIGS. 7B and 7C. For example, when a semiconductor film is crystallized, the characteristic of the crystal is different. In other word, when the laser irradiation is performed while scanning the substrate back and forth, the characteristic of the crystal is different according to the scanning direction. Therefore, in order to obtain the homogeneous crystallinity all over the substrate when the laser beam is irradiated obliquely, the substrate needs to be scanned only in one direction, which decreases the throughput.

Since the laser irradiation method of the present invention can irradiate the laser beam vertically to the semiconductor film, the beam spot can be easily transformed on the semiconductor film. Therefore, the laser beam can be irradiated homogeneously all over the irradiated region without decreasing the throughput.

Embodiment 1

In FIG. 1, a reference numeral 101 denotes a pulsed laser oscillator. The present invention can be applied to any laser when it can oscillate a laser beam having an ultrashort pulse width of 10 ps or less. For example, an excimer laser, an Ar laser, a Kr laser, a $CO_2$ laser, a YAG laser, a $Y_2O_3$ laser, a $YVO_4$ laser, a YLF laser, a $YAlO_3$ laser, a $GdVO_4$ laser, a ceramic laser, a glass laser, a ruby laser, an alexandrite laser, a Ti: sapphire laser, a copper vapor laser, or a gold vapor laser can be used.

This embodiment uses a $YVO_4$ laser having an output power of 8 W. A reference numeral 102 denotes a non-linear optical element. The laser oscillator 101 has a stable resonator and preferably has a spatial profile of $TEM_{00}$ mode. In the case of $TEM_{00}$ mode, the laser beam has Gaussian intensity distribution and is superior in focusing property. Therefore, the beam spot can be easily transformed into a desired shape. The laser beam emitted from the laser oscillator is not sufficiently absorbed in an amorphous silicon film, which is the irradiated object 106 in this embodiment, and therefore cannot give energy efficiently thereto. Therefore, the wavelength of the laser beam is converted into a second harmonic (532 nm) that is sufficiently absorbed in the amorphous silicon film by the non-linear optical element 102. It is noted that the kind and the wavelength of the laser are not limited to the second harmonic of the $YVO_4$ laser, and they may be selected according to the irradiated object 106. The pulse repetition rate is not limited in particular when it is selected from the scope of the present invention, and it is set to 80 MHz and the pulse width is set to 10 ps in this embodiment.

In the laser irradiation apparatus of the present invention, a non-linear optical element may be provided inside a resonator of the laser oscillator 101, or the non-linear optical element may be provided outside the resonator of the laser oscillator. The former structure has an advantage that the size of the apparatus becomes compact and that the accurate control of the resonator length is not necessary. The latter structure has an advantage that interaction of the fundamental wave and the harmonic can be ignored.

As the non-linear optical element 102, the crystal whose non-linear optical constant is relatively large such as KTP ($KTiOPO_4$), BBO ($\beta$-$BaB_2O_4$), LBO ($LiB_3O_5$), CLBO ($CsLiB_6O_{10}$), GdYCOB ($YCa_4O(BO_3)_3$), KDP ($KD_2PO_4$), $KB_5$, $LiNbO_3$, $Ba_2NaNb_5O_{15}$, or the like is used. Particularly, the crystal such as LBO, BBO, KDP, KTP, $KB_5$, CLBO, or the like can increase conversion efficiency from the fundamental wave into the harmonic.

A traveling direction of a laser beam emitted from the laser oscillator 101 is changed by a reflecting mirror 103 so as to be perpendicular to the irradiated object. In the case of using a general laser having the pulse width that is an order of nanosecond ($10^{-9}$ second), the incidence angle is set in the range of 5 to 30° in order to prevent the interference due to secondary beam reflected on a rear surface of the substrate. However, according to the present invention, since the interference due to the secondary beam reflected on the rear surface of the substrate can be suppressed by using the laser beam having a pulse width of 10 ps or less in the laser irradiation, the laser beam can be made incident vertically to the substrate in the present embodiment. Since the laser beam can be made incident vertically into the irradiated object, the homogeneous laser irradiation can be performed while keeping the same intensity distribution even when the irradiated object is scanned back and forth. As a result, the homogeneous laser irradiation can be performed with high throughput. When semiconductor elements are manufactured using the irradiated object crystallized or annealed by the laser having homogeneous intensity distribution, the variation between the semiconductor elements can be reduced, and the product having the stable quality can be provided.

A beam spot of a laser beam whose traveling direction is changed is shaped by a cylindrical lens 104 and a cylindrical lens 111 and is irradiated to the irradiated object mounted on a stage 107. In FIG. 1, the semiconductor film 106 formed over a substrate 105 corresponds to the irradiated object, and the reflecting mirror 103, the cylindrical lens 104, and the cylindrical lens 111 correspond to the optical system for condensing the laser beam on the semiconductor film 106.

Although a practitioner can set the focal length of the two cylindrical lenses 104 and 111 appropriately, the focal lens of the cylindrical lens 111, which is closer to the irradiated object, is made shorter than that of the cylindrical lens 104. For example, the focal length of the cylindrical lens 111 is set to 20 mm, and the focal length of the cylindrical lens 104 is set to 150 mm. On this occasion, the distance between the cylindrical lens 111 and the irradiated object is set to 20 mm. When the distance between the cylindrical lens 111 and the irradiated object is set to approximately 100 mm, the beam spot can be shaped into a linear beam that is long in an X direction.

In the crystallization step of the semiconductor film using the laser, throughput can be raised by shaping the beam spot into an ellipse or a rectangle that is long in one direction and by scanning the beam spot in the direction of its minor axis. The laser beam is shaped into the elliptical because the original shape of the laser beam is circular or near circular. The laser beam whose original shape is rectangular may be also used after transforming the laser beam by expanding it in one direction through a cylindrical lens or the like so that its long side becomes longer. Moreover, a plurality of laser beam each of which is extended long in one direction and shaped into a long ellipse or rectangle may be chained in one direction to form a longer beam in order to raise the throughput further. In this embodiment, the linear beam having a length of 300 µm in a direction of its major axis and a length of 10 µm in a direction of its minor axis is formed.

In the case of using the semiconductor film 106 formed over the substrate 105 as the irradiated object, when the semiconductor film 106 is an amorphous semiconductor, it is preferable to perform thermal annealing before the laser irradiation. Specifically, the thermal annealing may be performed for one hour in the nitrogenous atmosphere of 500° C. This thermal annealing can decrease the density of hydrogen to be $1 \times 10^{20}$ atoms/cm$^3$ or less. When the density of hydrogen in the semiconductor film is high, the hydrogen is emitted at a burst by the laser having high intensity, and the film may be destroyed.

Moreover, the crystallization may be performed by thermal annealing using the catalyst metal. The optimum condition of the laser irradiation is almost the same to the semiconductor film to which the thermal annealing is performed without using the catalyst element and to the semiconductor film to which the thermal annealing is performed using the catalyst element.

The stage 107 can move in XY directions in a plane parallel to the substrate 105 by a robot 108 scanning in an X-axis direction (uniaxial robot for X-axis) and a robot 109 scanning in a Y-axis direction (uniaxial robot for Y-axis).

The stage 107 is scanned in a direction of a minor axis of the beam spot 110 using the uniaxial robot 109 for Y-axis. The scanning speed of the stage 107 is appropriate in the range of several tens to several thousand mm/s, and it is set to 400 mm/s in this embodiment. The scanning of the stage 107 moves the beam spot 110 relative to the surface of the semiconductor film 106.

Figure 2:
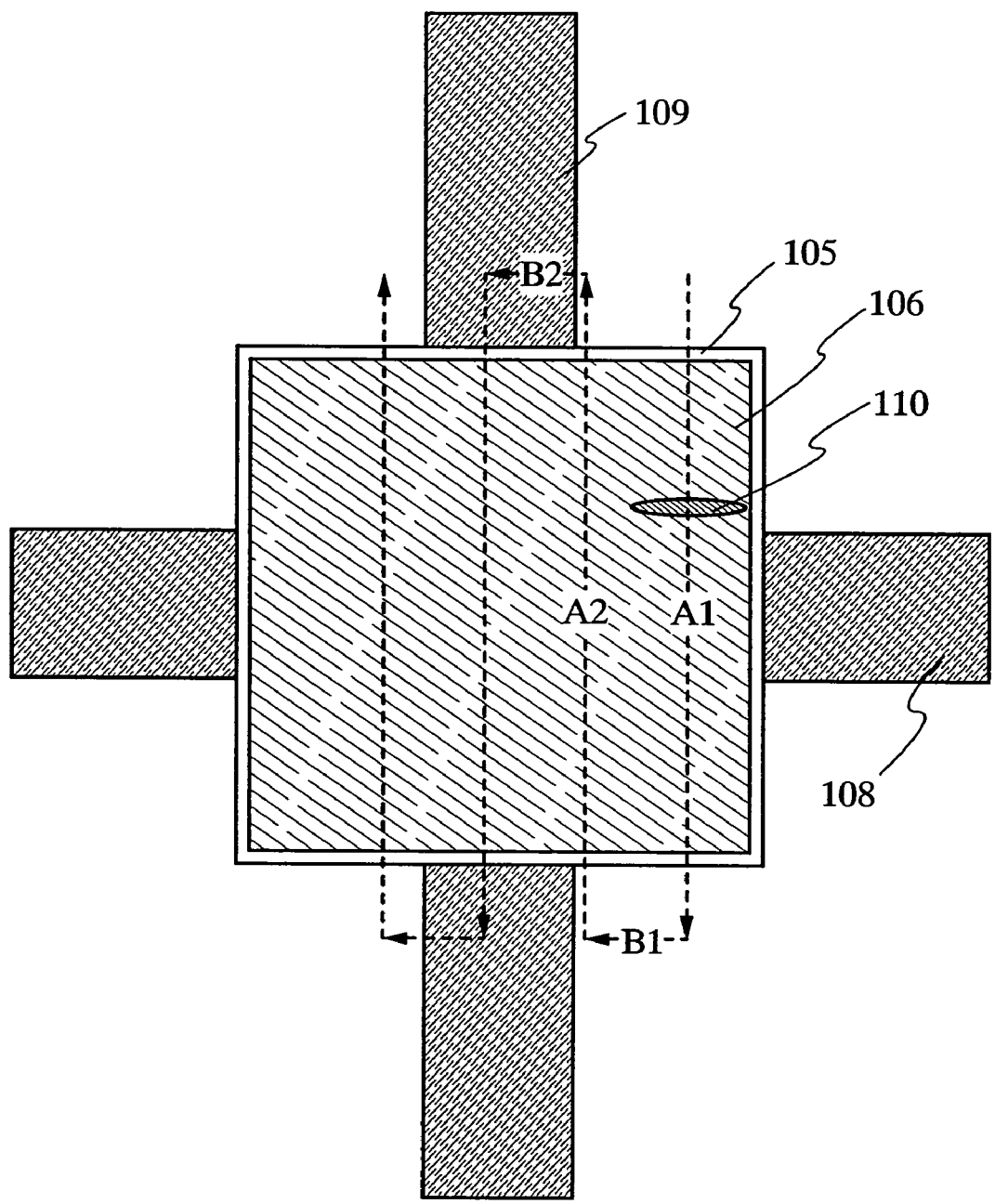
FIG. 2 is a drawing of a scanning route of a laser beam.

Next, FIG. 2 shows the scanning route of the beam spot 110 on the surface of the semiconductor film 106. In the case where the whole surface of the semiconductor film 106, which corresponds to the irradiated object, is irradiated with the laser beam, after the beam spot 110 is scanned in one direction using the uniaxial robot 109 for Y-axis, the beam spot 110 is slid using the uniaxial robot 108 for X-axis in the direction perpendicular to the direction scanned by the uniaxial robot 109 for Y-axis.

For example, the beam spot 110 is scanned in one direction by the uniaxial robot 109 for Y-axis. In FIG. 2, the scanning route is indicated by a reference character A1. Then, the beam spot 110 is slid in a direction perpendicular to the scanning route A1 using the uniaxial robot 108 for X-axis. The scanning route by the slide is indicated by a reference character B1. Next, the beam spot 110 is scanned in one direction opposite to the scanning route A1 with the use of the uniaxial robot 109 for Y-axis. This scanning route is indicated by a reference character A2. Next, the beam spot 110 is slid in a direction perpendicular to the scanning route A2 using the uniaxial robot 108 for X-axis. The scanning route by the slide here is indicated by a reference character B2. By repeating the scanning by the uniaxial robot 109 for Y-axis and the uniaxial robot 108 for X-axis in order, the whole area of the semiconductor film 106 can be irradiated with the laser beam.

In the present embodiment, by using the laser beam having an ultrashort pulse width of 10 ps or less, the interference due to the secondary beam reflected on the rear surface of the glass substrate can be suppressed, and the laser irradiation can be performed more homogeneously. Semiconductor elements manufactured using the irradiated object obtained in the present embodiment have the homogeneous characteristic.

The optical system used in the present invention is not limited to that in this embodiment, and another optical system can be used. Moreover, the present embodiment can be used in combination with the embodiment mode.

Embodiment 2

Figure 3:
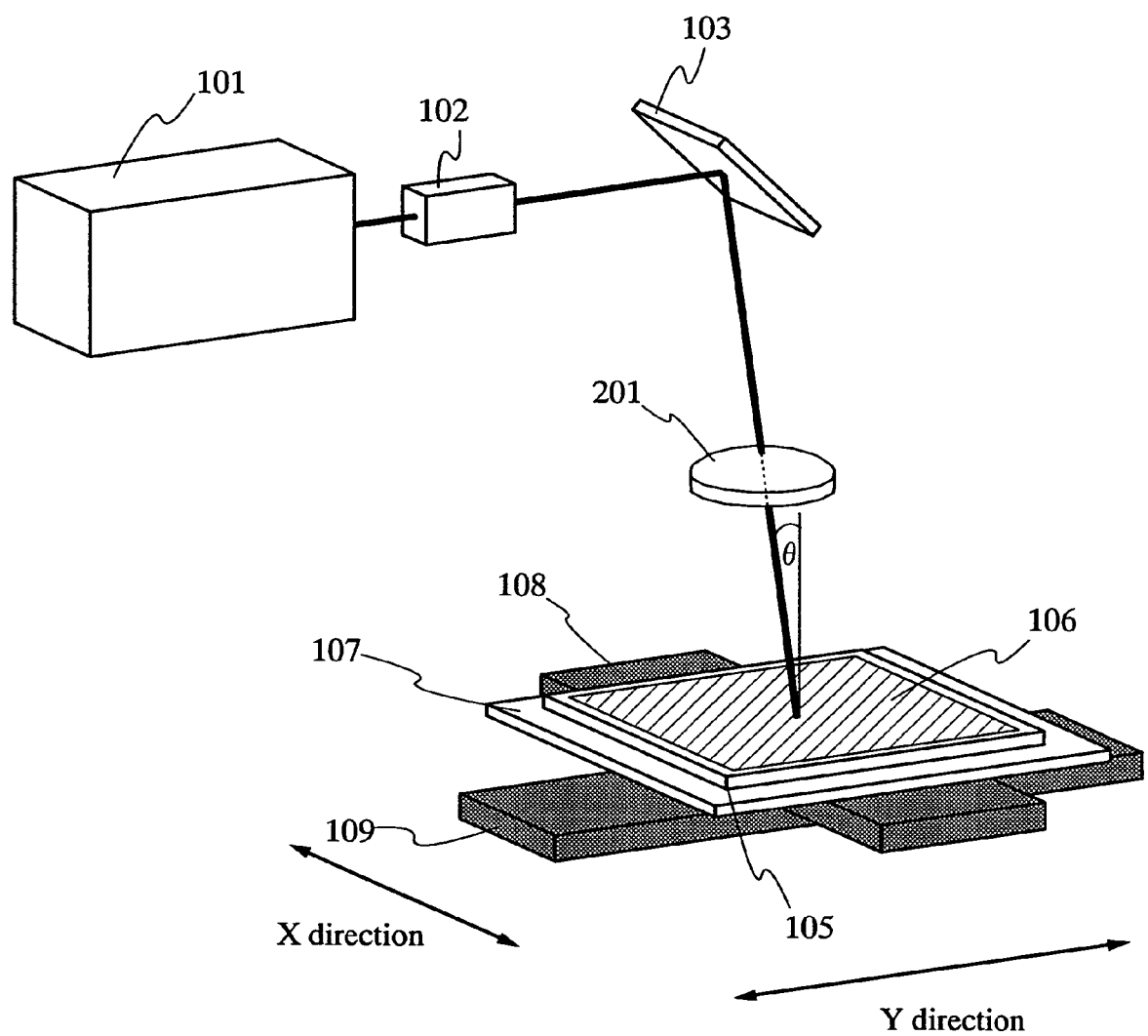
FIG. 3 is a drawing of a laser irradiation apparatus of the present invention.

This embodiment explains an optical system that can be used in the laser irradiation apparatus of the present invention with reference to FIG. 3.

Since a laser beam is generally emitted to the horizontal direction, the laser beam emitted from the laser oscillator 101 is reflected by a reflecting mirror 103, and its traveling direction is changed so as to have an angle (incident angle) θ from the vertical direction. In this embodiment mode, the angle θ is 18°. The beam spot of the laser beam whose traveling direction is changed is transformed by a lens 201 and is irradiated to a processing object mounted on a stage 107. In FIG. 3, a semiconductor film 106 formed over a substrate 105 is the processing object. Moreover, in FIG. 3, the reflecting mirror 103 and the lens 104 correspond to the optical system that condenses the laser beam on the semiconductor film 106.

FIG. 3 shows an example in which a planoconvex spherical lens is used as the lens 201. The planoconvex spherical lens 201 has a focal length of 20 mm. The planoconvex spherical lens is set so that the laser beam is incident into the center of the curved surface and that the plane portion thereof is parallel to the substrate 105. The distance between the plane portion of the planoconvex spherical lens 201 and the semiconductor film 106 is 20 mm. This forms a beam spot 110 having a size of approximately 10 µm×100 µm on the semiconductor film 106. The beam spot 110 can be extended long because of the effect of astigmatism of the planoconvex spherical lens 201.

Since the other elements are the same as those in the embodiment mode, the explanation is omitted here.

In this embodiment, the laser beam is made incident obliquely. Even in the case of the oblique incidence, the present invention can be applied. Although the incidence angle is not as large as those in FIGS. 7A to 7C, the present invention can suppress the interference. Thus, the laser irradiation can be performed homogeneously.

By using the laser beam having an ultrashort pulse width of 10 ps or less, the interference due to the secondary beam reflected on the rear surface of the glass substrate can be suppressed, and the laser irradiation can be performed more homogeneously. Semiconductor elements manufactured using the irradiated object obtained in the present embodiment have the homogeneous characteristic.

The optical system that can be used in the present invention is not limited to that shown in the present embodiment. Another optical system can be also employed. Moreover, the present embodiment can be used in combination with the embodiment mode.

Embodiment 3

When a semiconductor film is irradiated with a continuous wave (CW) laser beam, a crystal grain grown continuously in the scanning direction of the beam spot can be obtained. A region where the crystal grain is grown continuously in the scanning direction has superior crystallinity. Therefore, when this region is used as a channel-forming region of a TFT, a TFT having extremely high mobility and on current can be expected. However, the CW laser has many problems such as a short lifetime of the non-linear optical element, a small beam spot, a serious thermal effect to the substrate, and so on.

Since the present invention uses the laser beam having an ultrashort pulse width, the pulse repetition rate is high. Therefore, the pulsed laser beam can be emitted after the semiconductor film is melted by the previous laser beam and before the semiconductor film is solidified. This can form a crystal grain grown continuously to the scanning direction of the beam spot, which is the same as that obtained when the semiconductor film is crystallized by the CW laser beam.

Although the pulse repetition rate is high in such a crystallizing method, the laser is not the CW laser but the pulsed laser. Therefore, it is possible to extend the lifetime of the non-linear optical element, to enlarge the beam spot, and to suppress the thermal effect to the substrate. Moreover, the crystal grain grown continuously to the scanning direction that has superior crystallinity can be obtained.

When the CW laser is incident into the irradiated object vertically, the interference due to the secondary beam reflected on the rear surface of the substrate occurs, which causes the inhomogeneous irradiation of the laser beam. However, with the structure of the present invention, the crystal grain grown continuously to the scanning direction of the beam spot having very superior crystallinity can be obtained while suppressing or preventing the effect of the interference due to the secondary beam reflected on the rear surface of the substrate.

The crystal grain grown continuously in the scanning direction of the beam spot is obtained when the pulse repetition rate is 10 MHz or more, and this is extremely higher than that of the pulsed laser to be generally used, which is from several tens to several hundred Hz. It is said that it takes several tens to several hundred ns after the semiconductor film is irradiated with the laser beam until the semiconductor is solidified. When the pulse repetition rate is 10 MHz or more, the pulsed laser beam can be irradiated after the semiconductor film is irradiated with the previous laser beam and before the semiconductor is solidified. Therefore, unlike the conventional pulsed laser, it is possible to move the interface between the liquid phase and the solid phase continuously in the semiconductor film and to form a semiconductor film having a crystal grain grown continuously in the scanning direction. Specifically, an aggregation of crystal grains each of which has a length of 10 to 30 μm in the scanning direction and a length of approximately 1 to 5 μm in a direction perpendicular to the scanning direction can be obtained.

The region where the crystal grain grown continuously in the scanning direction by the irradiation of the laser beam has superior crystallinity. Therefore, high mobility and on-current can be expected. However, when the semiconductor film has a region where such high crystallinity is not necessary, the laser beam may not be irradiated to this region. Alternatively, the laser irradiation may be performed under the condition determined so that high crystallinity is not obtained, for example by increasing the scanning speed.

The present embodiment can be used in combination with the embodiment mode, the embodiment 1, or the embodiment 2.

Embodiment 4

The present embodiment explains a method for manufacturing a semiconductor element applied for a display device with the use of the laser irradiation apparatus and the laser irradiation method of the present invention with reference to FIGS. 4A to 5B.

A base insulating film 801 is formed on a substrate 800, and then an amorphous silicon film is formed on the base insulating film 801. Next, a crystalline silicon film is formed by irradiating the amorphous silicon film with the laser beam.

An insulating substrate such as a glass substrate, a quartz substrate, or a crystalline glass substrate; a ceramic substrate; a stainless substrate; a metal substrate such as tantalum, tungsten, or molybdenum; a semiconductor substrate; a plastic substrate such as polyimide, acrylic, polyethylene terephthalate, polycarbonate, polyarylate, or polyethersulfone; or the like can be used as the substrate 800. It is noted that the substrate 800 needs to be formed of the material that can resist the heat in the manufacturing process. These substrates may be used after being polished by a CMP method or the like as needed. In this embodiment, a glass substrate having a refractive index of 1.5 and a thickness of 0.7 mm that is manufactured by Asahi Glass Co., Ltd is used.

The base insulating film 801 is provided in order to prevent alkali-earth metal or alkali metal included in the substrate 800. The alkali-earth metal or the alkali metal causes an adverse effect on the semiconductor characteristic of the crystalline silicon film when it is inside the film. Therefore, the base insulating film is formed of a single layer of an insulating material such as silicon oxide, silicon nitride, silicon oxynitride, or silicon nitride oxide or formed by laminating the above material. When the substrate hardly diffuses the alkali-earth metal or the alkali metal, the base insulating film is not always necessary to be provided.

In this embodiment, the base insulating film 801 is formed of two layers. A first base insulating film is a silicon nitride oxide film having a thickness of 50 nm, and a second base insulating film is a silicon oxynitride film having a thickness of 100 nm. The difference between the silicon nitride oxide and the silicon oxynitride is the proportion of the nitrogen and oxygen. The silicon nitride oxide film contains more nitrogen than oxygen, and the silicon oxynitride film contains more oxygen than nitrogen. The first base insulating film is formed by a plasma CVD method under the condition where $SiH_4$, $N_2O$, $NH_3$, and $H_2$ are used as the material gas, the pressure is 40 Pa, the RF power is 50 W, the RF frequency is 60 MHz, and the substrate temperature is 400° C. The second base insulating film is formed by the plasma CVD method under the condition where $SiH_4$ and $N_2O$ are used as the material gas, the pressure is 40 Pa, the RF power is 150 W, the RF frequency is 60 MHz, and the substrate temperature is 400° C.

Next, an amorphous silicon film is formed in thickness from 25 to 100 nm (preferably from 30 to 60 nm) on the base insulating film by a known method such as a sputtering method, a reduced-pressure CVD method, or a plasma CVD method. In this embodiment, the amorphous silicon film is formed in 50 nm thick by the plasma CVD method.

After that, the amorphous silicon film is crystallized by the laser irradiation. Since the amorphous silicon film contains too much hydrogen, the hydrogen may be bumped by the irradiation of the high laser energy at the crystallization, and the film may be damaged. Therefore, a heat treatment is performed at a temperature of 500° C. for one hour in order to dehydrogenate the amorphous silicon film.

Next, the amorphous silicon film is crystallized by the laser irradiation apparatus of the present invention to form a crystalline semiconductor film. This embodiment uses a $YVO_4$ laser that provides a power of 2 W at 532 nm (second harmonic) with a pulse repetition rate of 80 MHz, a spatial profile of $TEM_{00}$ mode, and a pulse width of 7 ps. The beam spot formed on the amorphous silicon film, which is the irradiated object, is shaped into a rectangle having a length of 10 μm in a short side and a length of 70 μm in a long side by the optical system. The condition of the laser irradiation is not limited to that shown in this embodiment. The pulse width may be determined according to the calculation explained in the embodiment mode of the present invention. The other conditions may be selected in accordance with the application to which the present invention is used. In the present embodiment, the pulse width is determined so as not to cause the interference in the amorphous silicon film in consideration of the refractive index of the substrate and the wavelength of the laser.

In the present embodiment, after heating the substrate for an hour in the nitrogenous atmosphere of 500° C., the amorphous silicon film is crystallized by the laser annealing method to form a crystalline silicon film. In the laser annealing process, the scanning speed of the stage is appropriate in the range of several tens to several thousand mm/s, and it is set to 400 mm/s in this embodiment.

The laser beam having a wavelength of 532 nm partially transmits through the amorphous silicon film having a thickness of 50 nm, and it is reflected on a rear surface of the substrate. However, since the pulse width is as short as 10 ps, the time for which the secondary beam interferes with the primary beam is short considerably compared with the conventional case. Thus, the effect of the interference can be decreased to a large degree. As a result, the inhomogeneity of the crystallization state can be suppressed, and the semiconductor element having homogeneous characteristic can be manufactured.

When the pulse repetition rate is set to 10 MHz or more, the crystal grain grown long continuously in the scanning direction of the beam spot can be obtained. By corresponding the scanning direction with the channel direction of the TFT, a TFT having considerably high characteristic can be manufactured. However, the present invention is not limited to this.

As another crystallization method, a heat treatment may be performed using an element for promoting the crystallization of the amorphous silicon film. As the element for promoting the crystallization, nickel is given typically. With such an element, the crystallization can be performed at low temperature in short time compared with the case where the element is not used. Therefore, this crystallization method is preferable when the substrate does not have much resistance against the heat such as glass substrate. Moreover, one or a plurality of elements selected from the group consisting of nickel, iron, palladium, tin, lead, cobalt, platinum, copper, gold, or the like can be used to promote the crystallization.

The element can be added in such a way that the salt of the above element is melted in a solvent and then the solvent is applied by a spin coating method, a dip method, or the like. As the solvent, an organic solvent or water can be used for example. It is necessary to select the solvent and the salt that don't affect adversely the semiconductor characteristic because they contact the silicon film directly.

After performing the crystallization using the element for promoting the crystallization, the laser beam may be irradiated to improve the crystallinity. On this occasion, the laser irradiation method of the present invention can be employed. The laser to be used and the condition of the laser irradiation in this case may be the same as those in the laser crystallization step, and therefore they are not explained here.

Subsequently, a small number of impurities for controlling the threshold are added as needed to the crystalline semiconductor film, which is so-called channel doping. In order to obtain the required threshold, boron, phosphorous, or the like is added by an ion doping method or the like.

Figure 4A:
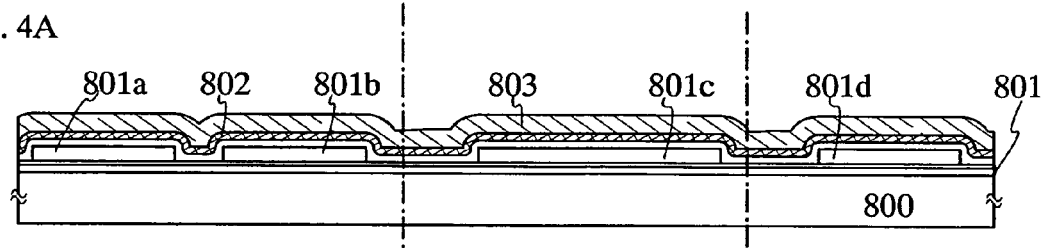
FIGS. 4A to 4D are drawings for showing the process for manufacturing a semiconductor device according to the present invention.
Figure 4B:
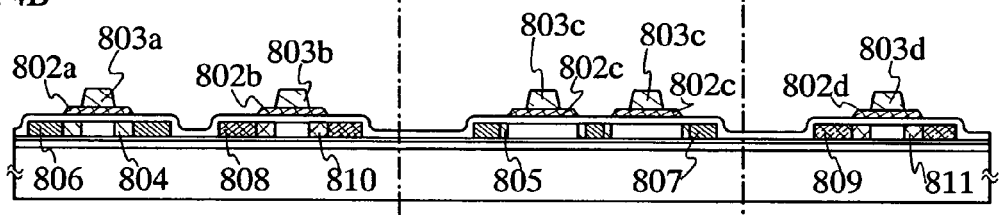
Figure 4C:
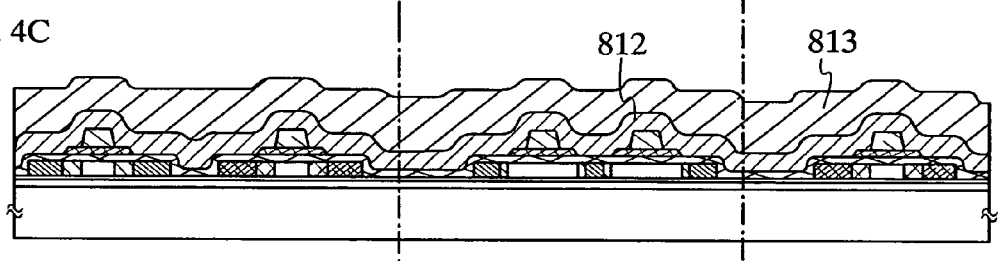
Figure 4D:
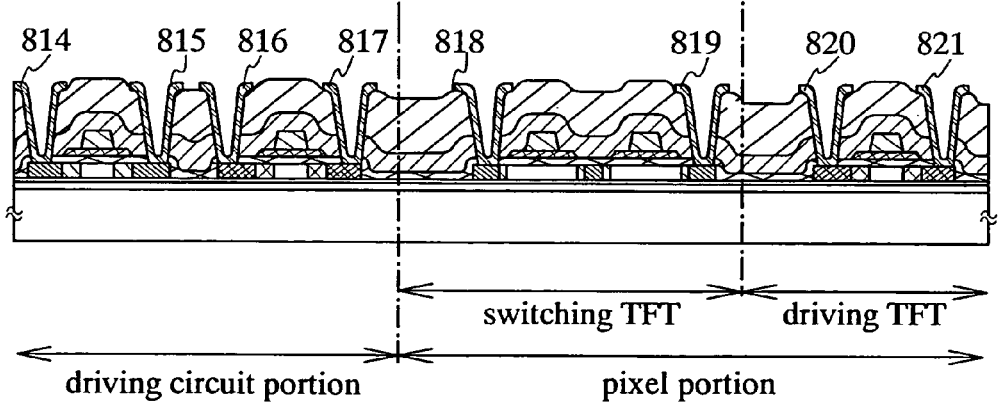

After that, the crystalline silicon film is patterned into a desired shape to form island-shaped crystalline silicon films 801*a* to 801*d* as shown in FIG. 4A. The crystalline silicon film is patterned in such a way that after a photo resist is applied on the crystalline silicon film, the photo resist is exposed and annealed so as to form a mask having the desired shape on the crystalline silicon film, and then the crystalline silicon film is etched by a dry etching method using the mask. $CF_4$, $O_2$, and the like may be used as the gas for the dry etching method.

Subsequently, a gate insulating film is formed of an insulating film including silicon in thickness from 40 to 150 nm by the plasma CVD method or the sputtering method to cover the crystalline semiconductor films 801*a* to 801*d*. In this embodiment, a silicon oxynitride film is formed in 115 nm thick as the gate insulating film by the plasma CVD method.

Next, a tantalum nitride (TaN) film 802 having a thickness of 30 nm is formed on the gate insulating film as a first conductive layer, and a tungsten (W) film 803 having a thickness of 370 nm is formed thereon as a second conductive layer. The TaN film may be formed by the sputtering method using Ta as a target in the nitrogenous atmosphere. The W film may be formed by the sputtering method using W as a target.

Although this embodiment forms the first conductive layer using TaN in 30 nm thick and the second conductive layer using W in 370 nm thick, the materials of these conductive layers are not limited to these elements. Both of the first and the second conductive layers may be formed of the element selected from the group consisting of Ta, W, Ti, Mo, Al, Cu, Cr, and Nd, or may be formed of a chemical compound material or an alloy material including the above element as its main component. In addition, a semiconductor film, typically a poly-crystalline silicon film, with the impurity such as phosphorus doped may be also employed. Moreover, AgPdCu alloy can be also used. Furthermore, the combination of these may be employed appropriately. The film thickness of the first conductive layer is preferably in the range of 20 to 100 nm, and that of the second conductive layer is preferably in the range of 100 to 400 nm. Although the present embodiment shows the two-layer structure, the conductive layer may be formed in a single-layer structure or a multilayer structure including three or more layers.

Next, a resist mask is formed through an exposure process according to the photolithography in order to form an electrode and a wiring by etching the conductive layers. The first etching process is performed under first and second etching conditions. The etching is performed using the resist mask to form a gate electrode and a wiring. The etching conditions are selected appropriately.

An ICP (Inductively Coupled Plasma) etching method is employed in this embodiment. The etching process is initially performed under the first etching condition in which $CF_4$, $Cl_2$, and $O_2$ are used as the etching gas at a gas flow rate of 25/25/10 (sccm) respectively, and plasma is generated by applying 500 W RF (13.56 MHz) electric power to a coil-shaped electrode at a pressure of 1.0 Pa. 150 W RF (13.56 MHz) electric power is also applied to the substrate side (sample stage), and substantially a negative self-bias voltage is applied. The W film is etched under the first etching condition, and the end portions of the first conductive layer are made into a tapered shape.

Next, the etching is performed under the second etching condition without removing the resist mask. In the second etching condition, $CF_4$ and $Cl_2$ are used as the etching gas at a gas flow rate of 30/30 (sccm) respectively and plasma is generated by applying 500 W RF (13.56 MHz) to a coil-shaped electrode at a pressure of 1.0 Pa. Then the etching process is performed for approximately 15 seconds. 20 W RF (13.56 MHz) electric power is also applied to the substrate side (sample stage), thereby a negative self-bias voltage is applied substantially. Under the second etching condition using the mixed gas of $CF_4$ and $Cl_2$, both the W film and the TaN film are etched to the same extent. It is noted that in order to perform the etching process without leaving a is residue on the gate insulating film, the time for etching may be increased by approximately 10 to 20%. In the first etching process, the gate insulating film not covered by the electrode is etched by approximately 20 to 50 nm, and the end portions of the first and the second conductive layers are made into tapered shape due to the effect of the bias voltage applied to the substrate side.

Next, a second etching process is performed without removing the resist mask. The second etching process is performed under the condition in which $SF_6$, $Cl_2$, and $O_2$ are used as the etching gas at gas flow rate of 24/12/24 (sccm) respectively and plasma is generated by applying 700 W RF (13.56 MHz) electric power to a coil-shaped electrode at a pressure of 1.3 Pa. Thus, the etching is performed for approximately 25 seconds. 10 W RF (13.56 MHz) electric power is also applied to the substrate side (sample stage), thereby a negative self-bias voltage is applied substantially. In this etching condition, the W film is etched selectively, and a second shaped conductive layer is formed. On the other hand, the first conductive layer is then hardly etched. The first and the second etching processes form a gate electrode including first conductive layers 802a to 802d and second conductive layers 803a to 803d.

Then, a first doping process is performed without removing the resist mask. The impurity element imparting n-type is doped in the crystalline semiconductor layer at low density through the first doping process. The first doping process may be performed by an ion doping method or an ion implantation method. The ion doping method may be performed under the condition in which the dosage ranges from $1\times10^{13}$ to $5\times10^{14}$ ions/cm$^2$ and the acceleration voltage ranges from 40 to 80 kV. In this embodiment, the acceleration voltage is set to 50 kV. The 15th element in the periodic table, typically phosphorus (P) or arsenic (As), can be used as an impurity element imparting n-type. Phosphorus (P) is used in this embodiment. On this occasion, the first conductive layer is used as a mask to form in a self-aligning manner a first impurity region ($N^{--}$ region) in which the impurity is added at low density.

Next, the resist mask is removed, and then a new resist mask is formed. A second doping process is performed at higher accelerating voltage than that in the first doping process. The impurity imparting n-type is also added in the second doping process. The ion doping method may be performed under the condition where the dosage is in the range of $1\times10^{13}$ to $3\times10^{15}$ ions/cm$^2$ and the accelerating voltage is in the range of 60 to 120 kV. In this embodiment, the dosage is set to $3.0\times10^{15}$ ions/cm$^2$ and the accelerating voltage is set to 65 kV. The second conductive layer is used as the mask against the impurity element in the second doping process, and the doping process is performed so that the impurity element is also added in the semiconductor layer that is positioned below the first conductive layer.

In the second doping process, a second impurity region ($N^-$ region) is formed in the part of the crystalline semiconductor layer that is not overlapped with the second conductive layer or that is not covered by the mask but that is overlapped with the first conductive layer. The impurity imparting n-type is added at density from $1\times10^{18}$ to $5\times10^{19}$ atoms/cm$^3$ in the second impurity region. In addition, the impurity imparting n-type is added at high density from $1\times10^{19}$ to $5\times10^{21}$ atoms/cm$^3$ in the part of the crystalline semiconductor film that is exposed without being covered by the first conductive layer and the mask (this part is a third impurity region: $N^+$ region). Moreover, the $N^+$ region exists in the semiconductor layer, and it is partially covered by only the mask. The density of the impurity in this part covered by only the mask is the same as that when the first doping process is performed, and therefore this part is still referred to as the first impurity region ($N^{--}$ region).

Although each impurity region is formed by performing the doping process twice in the present embodiment, the present invention is not limited to this, and the impurity regions having the desired impurity density may be formed by performing the doping process once or plural times under the condition determined appropriately.

Next, after removing the resist mask, a resist mask is newly formed to perform a third doping process. The third doping process forms a fourth impurity region ($P^+$ region) and a fifth impurity region ($P^-$ region) in which the impurity element imparting conductivity type opposite to that of the first and second impurity regions is added.

In the third doping process, a fourth impurity region ($P^+$ region) is formed in the part of the crystalline semiconductor layer that is not covered by the resist mask and that is not overlapped with the first conductive layer. And a fifth impurity region ($P^-$ region) is formed in the part that is not covered by the resist mask and that is not overlapped with the second conductive layer but that is overlapped with the first conductive layer. As the impurity element imparting p-type, the 13th element in the periodic table such as boron (B), aluminum (Al), or gallium (Ga) is known.

In the present embodiment, boron (B) is used as the impurity element imparting p-type to form the fourth and the fifth impurity regions, and the ion doping method is performed using diborane ($B_2H_6$) under the condition where the dosage is set to $1\times10^{16}$ ions/cm$^2$ and the accelerating voltage is set to 80 kV.

It is noted that the part where an n-channel TFT is formed is covered by the resist mask through the third doping process.

Here, phosphorus is added in the fourth impurity region ($P^+$ region) and the fifth impurity region ($P^-$ region) at the different density respectively by the third doping processes. However, the third doping process is performed so that the density of the impurity element imparting p-type ranges from $1\times10^{19}$ to $5\times10^{21}$ atoms/cm$^3$ in the fourth impurity region ($P^+$ region) and the fifth impurity region ($P^-$ region). Therefore, the fourth impurity region ($P^+$ region) and the fifth impurity region ($P^-$ region) work as a source region and a drain region of the p-channel TFT without any problems.

Although the present embodiment forms the fourth impurity region ($P^+$ region) and the fifth impurity region ($P^-$ region) by performing the third doping process once, is the present invention is not limited to this. The fourth impurity region ($P^+$ region) and the fifth impurity region ($P^-$ region) may be formed by performing the doping process plural times appropriately according to the condition in the doping process.

These doping processes form the first impurity region ($N^{--}$ region) 805, the second impurity region ($N^-$ region) 804, the third impurity regions ($N^+$ region) 806 and 807, the fourth impurity regions ($P^+$ region) 808 and 809, and the fifth impurity regions ($P^-$ region) 810 and 811.

Next, the resist mask is removed, and then a first passivation film 812 is formed. An insulating film including silicon is formed in thickness from 100 to 200 nm as the first passivation film. A plasma CVD method or a sputtering method may be employed as the film-forming method.

In the present embodiment, a silicon oxide film including nitrogen is formed in 100 nm thick by the plasma CVD method. As the silicon oxide film including nitrogen, a silicon oxynitride film formed using the gases of $SiH_4$, $N_2O$, and $NH_3$; a silicon oxynitride film formed using the gases of $SiH_4$ and $N_2O$; or a silicon oxynitride film formed using the gas in which $SiH_4$ and $N_2O$ are diluted with Ar by the plasma-CVD method can be used. In addition, a silicon oxynitride hydride film manufactured using $SiH_4$, $N_2O$, and $H_2$ may be applied as the first passivation film. Of course, the first passivation film 812 may be formed of not only the single-layer structure of the silicon oxynitride film as shown in this embodiment, but also the single layer or a multilayer of another insulating film including silicon.

Next, an interlayer insulating film 813 is formed on the first passivation film 812. An inorganic insulating film or an organic insulating film can be used as the interlayer insulating film 813. A silicon oxide film formed by the CVD method or a silicon oxide film applied by an SOG (Spin On Glass) method can be used as the inorganic insulating film. A film of polyimide, polyamide, BCB (benzocyclobutene), acrylic, positive photosensitive organic resin, or negative photosensitive organic resin can be used as the organic insulating film. Moreover, a siloxane film, which is formed of the material including at least hydrogen in the substituent or which includes, in addition to that, at least one of fluoric acid, alkyl, and aromatic hydrocarbon in the substituent can be used as the organic insulating film. A multilayer including the above materials may be used.

In this embodiment, the interlayer insulating film 813 is formed of siloxane. After applying the siloxane polymer to all over the surface as the interlayer insulating film, a heat treatment is performed at temperatures from 50 to 200° C. for 10 minutes to dry it. Then, the siloxane polymer is baked at temperatures from 300 to 450° C. for 1 to 12 hours. This baking process forms a siloxane film in 1 μm thick. This process can not only anneal the siloxane polymer but also hydrogenate the semiconductor layer and activate the impurity using the hydrogen in the first passivation film 812 at the same time. Therefore, the number of processes can be decreased, and the process can be simplified. The hydrogenation is to terminate the dangling bond of the semiconductor layer using the hydrogen included in the first passivation film.

When the interlayer insulating film is formed of the material different from the siloxane, a heat treatment is needed for the hydrogenation and activation. In this case, the heat treatment needs to be performed separately before forming the interlayer insulating film. The heat treatment may be performed at temperatures from 400 to 700° C. in the nitrogenous atmosphere including oxygen for 1 ppm or less, preferably 0.1 ppm or less. In this embodiment, the heat treatment is performed at a temperature of 410° C. for an hour for the activation. As the heat treatment, a laser annealing method or a rapid thermal annealing (RTA) method can be applied. In the laser annealing method, the laser irradiation apparatus and the laser irradiation method of the present invention can be used.

The heat treatment may be performed before forming the first passivation film 812. However, when the materials of the first conductive layers 802a to 802d and the second conductive layers 803a to 803d don't have enough resistance against the heat, it is preferable to perform the heat treatment after forming the first passivation film 812 in order to protect the wiring and the like as shown in the present embodiment. Moreover, in this case, since there is not the first passivation film, the hydrogenation using the hydrogen included in the passivation film cannot be performed. In this case, the hydrogenation may be performed using hydrogen excited to be plasma (plasma hydrogenation) or may be performed by a heat treatment at temperatures from 300 to 450° C. for 1 to 12 hours in the atmosphere including hydrogen in the range of 3 to 100%.

After that, a silicon nitride oxide film or a silicon oxynitride film may be formed to cover the interlayer insulating film 813. When a conductive layer to be formed later is etched, the silicon nitride oxide film or the silicon oxynitride film works as an etching stopper to prevent the interlayer insulating from being overetched. Moreover, a silicon nitride film may be formed on the silicon nitride oxide film or the silicon oxynitride film. Since this silicon nitride film suppresses the moving of an alkali-metal ion, it is possible to suppress that the metal ion of lithium, sodium, or the like moves from a pixel electrode to be formed later to the semiconductor thin film.

Next, a contact hole reaching the crystalline semiconductor layers 801a to 801d is formed by patterning and etching the interlayer insulating film. Specifically, the contact hole is formed in such a way that the siloxane film is etched using the mixed gas of $CF_4$, $O_2$, and He and then the silicon oxide film as the gate insulating film is etched using $CHF_3$ gas.

Subsequently, a plurality of metal films is formed in the contact hole, and they are patterned to form a source electrode and a drain electrode. In this embodiment, a titanium film including nitrogen is formed in 100 nm thick, a titanium-aluminum alloy film is formed in 350 nm thick thereon, and a titanium film is further formed in 100 nm is thick on the titanium-aluminum alloy film. After that, source electrodes and/or drain electrodes 814 to 821 are formed by patterning and etching these three layers into a desired shape.

The titanium film including a nitrogen atom is formed by the sputtering method under the condition where titanium is used as the target and the flow rate of nitrogen and Ar is 1:1. When the titanium film including nitrogen is formed on the siloxane interlayer insulating film, a wiring that is hard to be peeled and that has low-resistance connection with the crystalline silicon film can be formed.

The above processes can manufacture a semiconductor element such as a TFT or a capacitor. Since the semiconductor film used for the semiconductor element such as the TFT or the capacitor is crystallized using the laser irradiation apparatus and the laser irradiation method of the present invention, it is possible to suppress the interference due to the secondary beam reflected on a rear surface of the substrate and to perform the crystallization of the semiconductor film more homogeneously. As a result, the characteristic of the semiconductor element formed over the substrate can be made more homogeneous. When such a semiconductor element is used as a pixel portion of the display device, it is possible to prevent the variation of the characteristic of the TFT due to the inhomogeneous crystallization from being visible. This makes it possible to provide the display device having high-quality image.

Embodiment 5

Figure 5A:
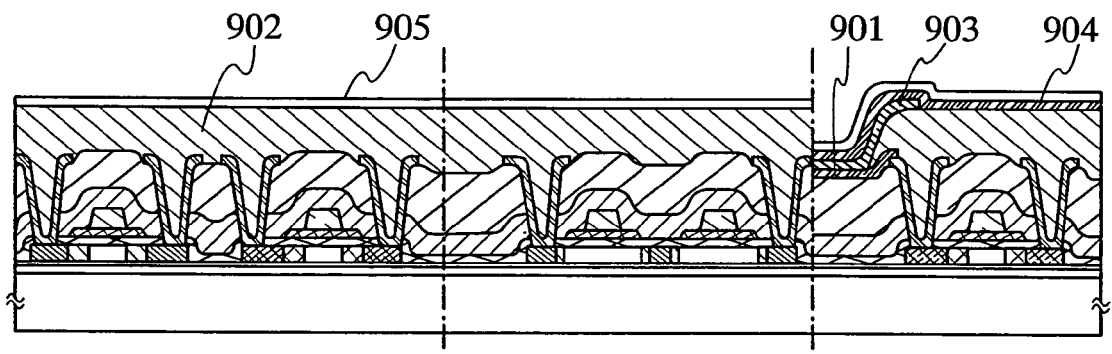
FIGS. 5A and 5B are drawings for showing the process for manufacturing a semiconductor device according to the present invention.
Figure 5B:
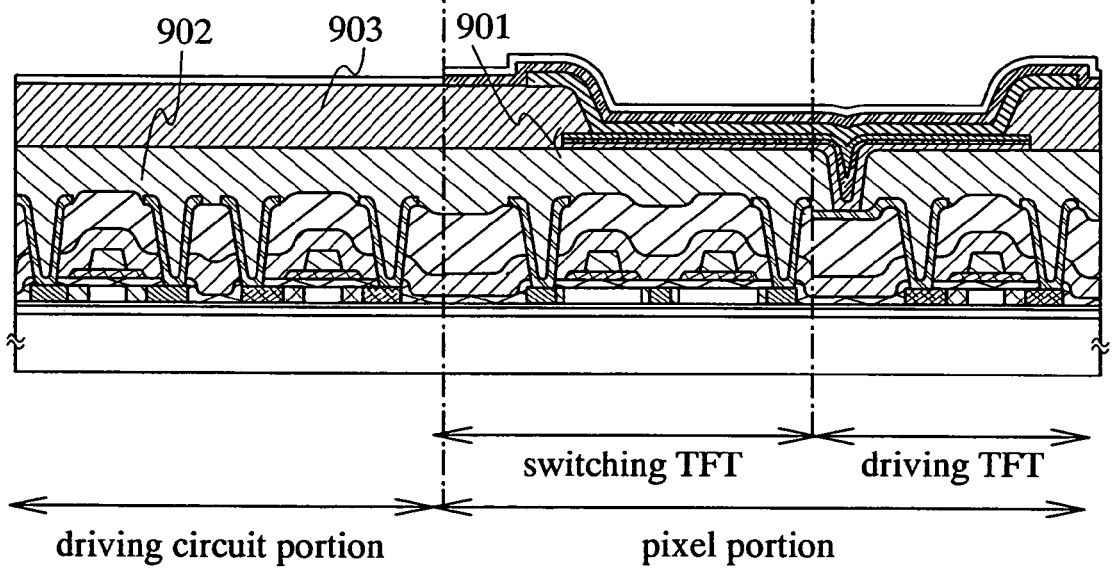

This embodiment explains an example in which the element substrate obtained in the embodiment 3 is used to manufacture a light-emitting display device with reference to FIGS. 5A and 5B. The light-emitting display device explained in this embodiment includes the light-emitting elements arranged in a matrix form, and the light-emitting elements have a layer including a light-emitting material sandwiched between a pair of electrodes and emit light by supplying current between the pair of electrodes.

As the excited state of the light-emitting element, a singlet-excited state and a triplet-excited state are known. It is considered that the light emission is possible by any one of them. Therefore, according to the characteristic of the light-emitting element, a light-emitting display device may include both an element of the singlet-excited state and an element of the triplet-excited state. For example, among the three colors of R (red), G (green), and B (blue), the element of triplet-excited state is used as R, and the elements of singlet-excited state are used as B and G. Since the element of the triplet-excited state obtains high emission efficiency in general, it contributes to the lowering of the drive voltage.

As the material of the light-emitting element, there are low-molecular-weight light-emitting material, a high-molecular-weight light-emitting material, and a medium-molecular-weight light-emitting material having an intermediate property between the former two light-emitting materials. In this embodiment, the low-molecular-weight light-emitting material is used. Both the low-molecular-weight material and the high-molecular-weight material can be applied by spin coating or ink jetting after melting them in a solution. Moreover, not only an organic material but also a complex material of the organic material and an inorganic material can be used.

A first electrode 901 of the light-emitting element is formed to overlap partially with the drain electrode of the TFT manufactured in the former step. The first electrode is an anode or a cathode. When the first electrode is the anode, it is preferable to use metal, alloy, conductive compound, or mixture of these each having a work function as high as approximately 4.0 eV or more. Specifically, ITO (indium tin oxide), IZO (indium zinc oxide) including indium oxide which is mixed with tin oxide (ZnO) in the range of 2 to 20%, ITSO (indium tin silicon oxide) including indium oxide which is mixed with silicon oxide ($SiO_2$) in the range of 2 to 20%, gold (Au), platinum (Pt), nickel (Ni), tungsten (W), chromium (Cr), molybdenum (Mo), iron (Fe), cobalt (Co), copper (Cu), palladium (Pd), or the metallic nitride material such as TiN can be used as the anode material.

When the first electrode is the cathode, it is preferable to use metal, alloy, conductive compound, a mixture of these, or the like each having low work function (work function of approximately 3.8 eV or less) as the cathode material. Specifically, the cathode can be formed of the material such as the element belonging to the first group or the second group in the periodic table, for example alkali metal such as Li or Cs; Mg; alkali-earth metal such as Ca or Sr; alloy including these such as Mg—Ag or Al—Li; a chemical compound such as LiF, CsF, or $CaF_2$; or transition metal including the rare-earth metal. However, since the second electrode is formed so that the light transmits therethrough in this embodiment, the second electrode is formed by forming these metals or the alloy including these metals extremely thinly and by laminating the material such as ITO, IZO, ITSO, or another metal (including alloy).

In this embodiment, the first electrode 901 is an anode formed of ITSO. When ITSO is used as the electrode, the reliability of the light-emitting display device is enhanced by performing the vacuum bake.

Although the first electrode is formed after manufacturing the source electrode and the drain electrode of the TFT in the present embodiment, the first electrode may be formed before manufacturing the electrodes of the TFT.

An insulating film 902 is formed to cover an end portion of the first electrode 901, which is a pixel electrode connected to the TFT in the pixel portion. The insulating film 902 is referred to as a bank or partition wall. As the insulating film 902, an inorganic insulating film or an organic insulating film can be used. As the inorganic insulating film, there are a silicon oxide film formed by the CVD method, a silicon oxide film applied by the SOG (Spin On Glass) method, and the like. As the organic insulating film, there are photosensitive or nonphotosensitive polyimide, polyamide, BCB (benzocyclobutene), acrylic, positive photosensitive organic resin, or negative photosensitive organic resin. Moreover, a siloxane film, which is the material which includes at least hydrogen in the substituent or which includes, in addition to that, at least one of fluoric acid, alkyl, and aromatic hydrocarbon in the substituent can be used as the insulating film 902. Moreover, a film formed by laminating the above materials may be used. It is preferable to use the photosensitive organic material because an opening having the cross-sectional shape whose radius of curvature gradually changes is formed and therefore an electroluminescent layer can be deposited without a break in a shape of the opening. The photosensitive polyimide is used in this embodiment.

Subsequently, the vapor deposition is performed using the vapor deposition apparatus in such a way that the vapor deposition source is moved in a film-forming chamber that is vacuumed so that the degree of vacuum is 0.667 Pa or less, preferably in the range of $1.33 \times 10^{-4}$ to $1.33 \times 10^{-2}$ Pa. At the vapor deposition, the organic compound is vaporized in advance due to the resistant heat, and it spatters toward the substrate by opening the shutter. The vaporized organic compound spatters upward and deposited on the substrate through an opening provided in the metal mask to form an electroluminescent layer 903 (including a hole-injecting layer, a hole-transporting layer, a light-emitting layer, a laminated body, and an electron-injecting layer from the side of the first electrode). It is noted that the structure of the electroluminescent layer 903 is not limited to the above, and it may be a single layer. When the electroluminescent layer 903 has the laminated-layer structure, two layers adjacent to each other may sandwich therebetween a layer in which the respective materials of the adjacent layers are mixed.

After forming the electroluminescent layer 903, a second electrode 904 is formed so as to contact the electroluminescent layer 903. Since the first electrode 901 is the anode in the present embodiment, the second electrode 904 is formed as the cathode. As the material of the cathode, the material mentioned above may be used. In this embodiment, the second electrode (cathode) 904 is an aluminum film having a thickness of 150 nm.

Since only the first electrode 901 is formed of the light-transmitting material in the present embodiment, the light is taken out from the bottom surface of the substrate. FIG. 5B is an example of a top-emission structure in which the pixel electrode 901 and the electrode of the TFT are formed in the different layer. The first interlayer insulating film 813 and the second interlayer insulating film 902 can be formed of the same material as that of the interlayer insulating film 813 shown in FIG. 5, and its combination can be selected freely. In this embodiment, both layers are formed of siloxane. The pixel electrode 901 is formed by laminating Al—Si alloy, TiN, and ITSO in order from the side of the second interlayer insulating film 902. The structure is not limited to this, and it may be a single-layer structure or a multilayer structure including two layers or four or more layers.

Figure 6A:
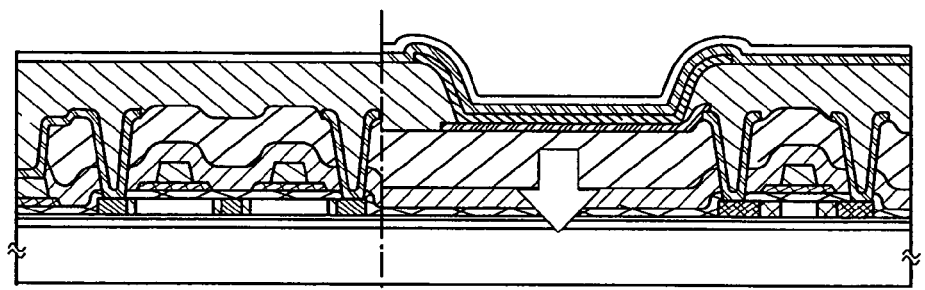
FIG. 6A to 6C are drawings of examples of light-emitting display devices.
Figure 6B:
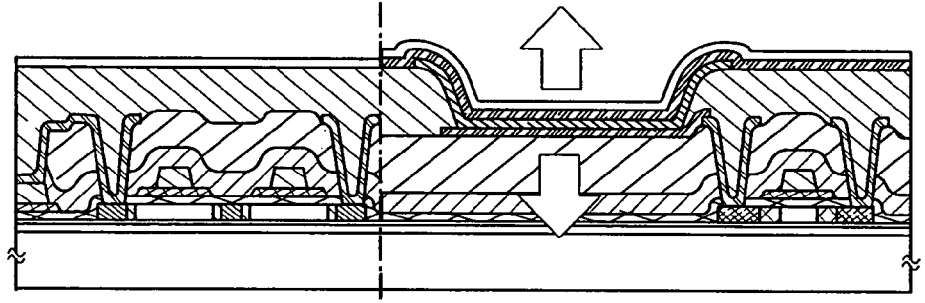
Figure 6C:
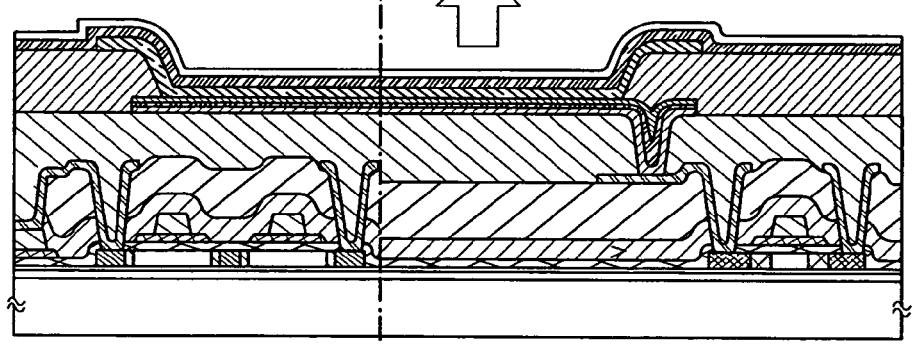

FIGS. 6A to 6C show examples of a bottom-emission structure, a dual-emission structure, and a top-emission structure. The structure in which the light is taken out from the bottom surface of the substrate described in the present embodiment corresponds to the bottom-emission structure in FIG. 6A. When a material including Li is formed below the second electrode in the thickness of such a degree that the light can transmit and when the second electrode is formed of the light-transmitting material such as ITO, ITSO, or IZO, the light-emitting display device having the dual-emission structure in which the light is taken out from both the top surface and the bottom surface of the substrate shown in FIG. 7B can be obtained. It is noted that even though the aluminum or the silver formed thickly does not transmit the light, they can transmit the light by forming it very thinly. Therefore, when the second electrode is formed of the aluminum or the silver in the thickness of such a degree that the light can transmit, the dual-emission structure can be obtained.

FIG. 6C is an example of a top-emission light-emitting display device, which is the same structure as that in FIG. 5B. When the number of interlayer films is increased by one compared with the structure of FIGS. 6A and 6B, another light-emitting element can be provided above the TFT, which is advantageous because the numerical aperture can be increased.

Since the transparent electrode such as ITO or ITSO, which is used in the dual-emission structure or the top-emission structure, cannot be formed by the vapor deposition method, it is formed by the sputtering method. When the second electrode 904 is formed by the sputtering method, the surface of the electron-injecting layer or an interface between the electron-injecting layer and the electron-transporting layer may be damaged by the sputtering, and the characteristic of the light-emitting element may be adversely affected. In order to prevent this, it is preferable to provide a material that is hard to be damaged by the sputtering in the position closest to the second electrode 904. Molybdenum oxide ($MoO_x$) is given as the material that is hard to be damaged by the sputtering and that can be used as the electroluminescent layer 903. However, since $MoO_x$ is the preferable material as the hole-injecting layer, it is necessary that the second electrode 904 is the anode in order to provide $MoO_x$ in contact with the second electrode 904. The element in which the first electrode is the cathode and the second electrode is the anode is referred to as a reversely laminated element in this specification.

Consequently, in the case of the reversely laminated element, the first electrode 901 is formed as the cathode, and then the electron-injecting layer, the electron-transporting layer, the light-emitting layer, the hole-transporting layer, the hole-injecting layer ($MoO_x$), and the second electrode (anode) are formed in order. It is necessary that the TFT for driving the pixel is an N-channel type.

The $MoO_x$ is formed by the vapor deposition method, and it is preferable that x is in the range of 3.1 to 3.2. Moreover, the $MoO_x$ layer may be a layer in which an organic material and an inorganic material are mixed by co-evaporating with the organic material, for example an organic metal complex such as copper phthalocyanine (CuPc). In the case of using the reversely laminated element, it is preferable that the TFT of the pixel portion employs the transistor using a-Si:H that is originally N-type as the semiconductor layer because the process can be simplified. When the driver circuit portion is formed over the same substrate, only the driver circuit portion may be crystallized by the laser irradiation method of the present invention.

After that, a silicon oxide film including nitrogen is formed as a second passivation film 905 by the plasma CVD method. As the silicon oxide film including nitrogen, a silicon oxynitride film manufactured using $SiH_4$, $N_2O$, and $NH_3$; a silicon oxynitride film manufactured using $SiH_4$ and $N_2O$; or a silicon oxynitride film manufactured using the gas in which $SiH_4$ and $N_2O$ are diluted with Ar may be formed by the plasma CVD method. Moreover, a silicon oxynitride hydride film manufactured using $SiH_4$, $N_2O$, and $H_2$ may be used as the first passivation film. The second passivation film 905 is not limited to a single-layer structure and it may be a single layer or a multilayer of another insulating film including silicon. Moreover, a multilayer of a carbon nitride film and a silicon nitride film; a multilayer of styrene polymer; a silicon nitride film; or a diamond-like-carbon film may be used instead of the silicon oxide film including nitrogen.

Subsequently, in order to protect the electroluminescent element from the material promoting the deterioration such as water, the display portion is sealed. When an opposing substrate is used to seal the display portion, the element substrate and the opposing substrate are pasted so as to expose an external connection portion with the use of an insulative sealing material. The space between the opposing substrate and the element substrate may be filled with the inert gas such as dry nitrogen, or the sealing material may be applied all over the pixel portion by which the opposing substrate is formed. As the sealing material, it is preferable to use ultraviolet curable resin or the like. A drying agent or a particle for keeping the same gap may be mixed into the sealing material. Subsequently, the flexible wiring substrate is pasted to the external connection portion, and this completes an electroluminescent panel.

Such an electroluminescent panel displays the image in various ways. For example, the electroluminescent panel displays the image with a single color, an area color, a full color, or the like. In the case of the full-color display, there are a method in which R, G, and B are manufactured individually, a method in which R, G, and B are obtained by providing a color filter to a white-color light source, a method in which a color having a short wavelength is converted into a color having a long wavelength using a color-conversion layer, and so on. Moreover, a color filter may be used to improve the color purity.

It is noted that any one of an analog video signal and a digital video signal may be used in the light-emitting display device of the present invention. In the digital video signals, there are a video signal using the voltage and a video signal using the current. In other words, the video signal input into the pixel uses the constant voltage or the constant current when the light-emitting element emits light. When the video signal uses the constant voltage, the voltage applied to the light-emitting element or the current flowing in the light-emitting element is constant. On the other hand, when the video signal uses the constant current, the voltage applied to the light-emitting element or the current flowing in the light-emitting element is constant. The former one in which the constant voltage is applied to the light-emitting element is referred to as a constant voltage drive, while the latter one in which the constant current flows in the light-emitting element is referred to as a constant current drive. The constant current drive flows the constant current without being affected by the change of the resistance of the light-emitting element. Any one of the video signal using the constant voltage and the video signal using the constant current may be used in the light-emitting display device and its driving method. Moreover, any one of the constant voltage drive and the constant current drive may be employed.

Although the embodiment 5 and the embodiment 3 showed an example in which the present invention is applied to the light-emitting display device, the present invention can be applied to any electronic devices using a semiconductor element including a thin film formed by applying the laser annealing. Since the characteristic of the semiconductor element manufactured by the present invention has less variation, it is possible to provide a product having the stable quality.

As the examples of such electronic devices, a video camera, a digital camera, a head mounted display (goggle type display), a car navigation, a car stereo, a personal computer, portable information terminal (such as a mobile computer, cellular phone, electronic book, and the like) and the like. These examples are shown in FIG. 8A to 9C. Or, the present invention can be applied to general electronic devices such as IC chip, ID chip, and RFID.

Figure 8A:
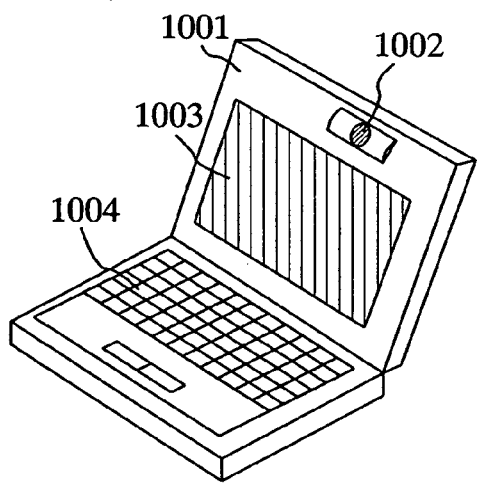
FIGS. 8A to 8F are drawings for showing electronic devices to which the present invention is applied.

FIG. 8A shows a personal computer, comprising a main body 1001, an image reader 1002, a display portion 1003, a key board 1004, and the like. A semiconductor element formed by applying the laser irradiation method of the present invention can be applied to the display portion 1003. The semiconductor element formed by applying the laser irradiation method of the present invention has less variation, it is possible to provide a stable display quality.

Figure 8B:
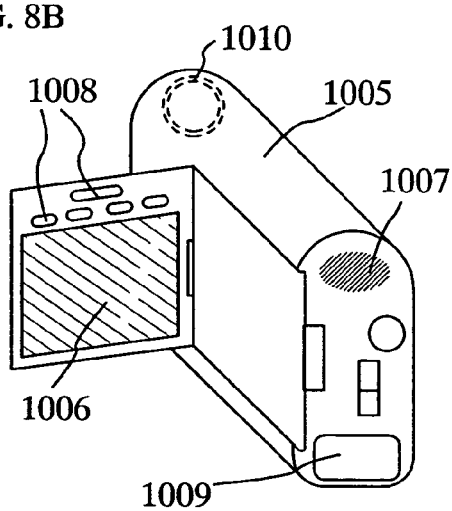

FIG. 8B shows a video camera, comprising a main body 1005, a display portion 1006, a voice input portion 1007, an operating switch 1008, a battery 1009, an image receiver 1010, and the like. A semiconductor element formed by applying the laser irradiation method of the present invention can be applied to the display portion 1006. The semiconductor element formed by applying the laser irradiation method of the present invention has less variation, it is possible to provide a stable display quality.

Figure 8C:
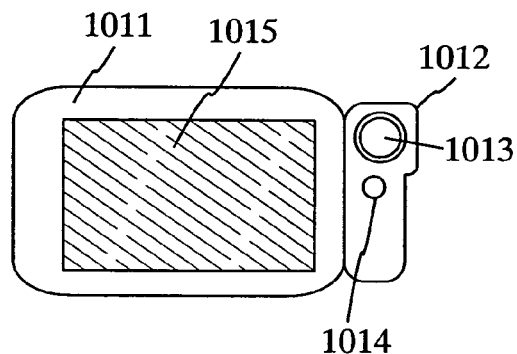

FIG. 8C shows a mobile computer, comprising a main body 1011, a camera portion 1012, an image receiver 1013, an operating switch 1014, a display portion 1015 and the like. A semiconductor element formed by applying the laser irradiation method of the present invention can be applied to the display portion 1015. The semiconductor element formed by applying the laser irradiation method of the present invention has less variation, it is possible to provide a stable display quality.

Figure 8D:
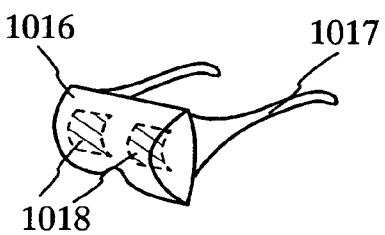

FIG. 8D shows a goggle type display, comprising a main body 1016, a display portion 1017, an arm portion 1018 and the like. The display portion 1017 includes a flexible substrate which is inflected to manufacture the goggle type display. In addition, the goggle type display can be made lightweight and thin. A semiconductor element formed by applying the laser irradiation method of the present invention can be applied to the display portion 1017. The semiconductor element formed by applying the laser irradiation method of the present invention has less variation, it is possible to provide a stable display quality.

Figure 8E:
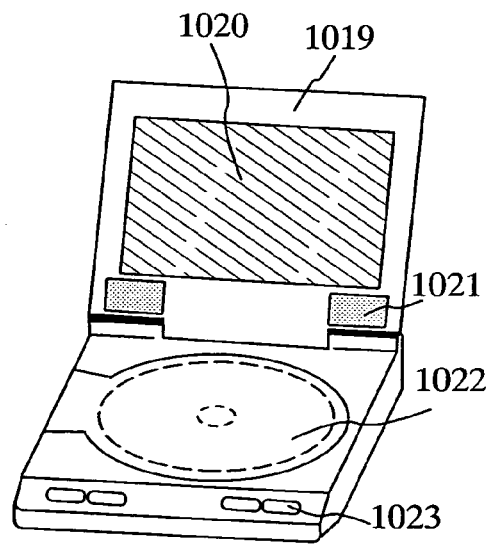

FIG. 8E shows a player utilizing a recording medium that has a program recorded (hereinafter referred to as a recording medium), comprising a main body 1019, a display portion 1020, a speaker portion 1021, a recording medium 1022, an operating switch 1023 and the like. It is noted that this player enables to enjoy listening to the music, watching the movies, playing the game, and playing on the Internet using a DVD (Digital Versatile Disc), CD or the like as its recording medium. A semiconductor element formed by applying the laser irradiation method of the present invention can be applied to the display portion 1020. The semiconductor element formed by applying the laser irradiation method of the present invention has less variation, it is possible to provide a stable display quality.

Figure 8F:
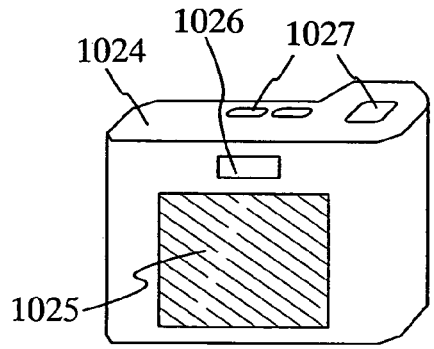

FIG. 8F shows a digital camera, comprising a main body 1024, a display portion 1025, an eye piece 1026, an operating switch 1027, an image receiver (not shown in the figure) and the like. A semiconductor element formed by applying the laser irradiation method of the present invention can be applied to the display portion 1025. The semiconductor element formed by applying the laser irradiation method of the present invention has less variation, it is possible to provide a stable display quality.

Figure 9A:
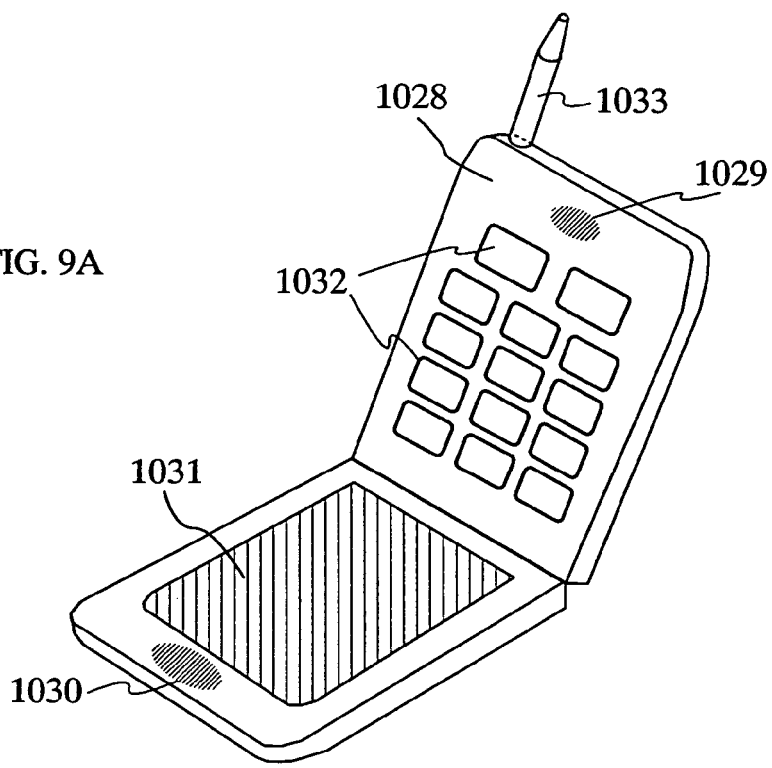
FIGS. 9A to 9C are drawings for showing electronic devices to which the present invention is applied.

FIG. 9A shows a cellular phone, comprising a main body 1028, a voice output portion 1029, a voice input portion 1030, a display portion 1031, an operating switch 1032, an antenna 1033 and the like. A semiconductor element formed by applying the laser irradiation method of the present invention can be applied to the display portion 1031. The semiconductor element formed by applying the laser irradiation method of the present invention has less variation, it is possible to provide a stable display quality.

Figure 9B:
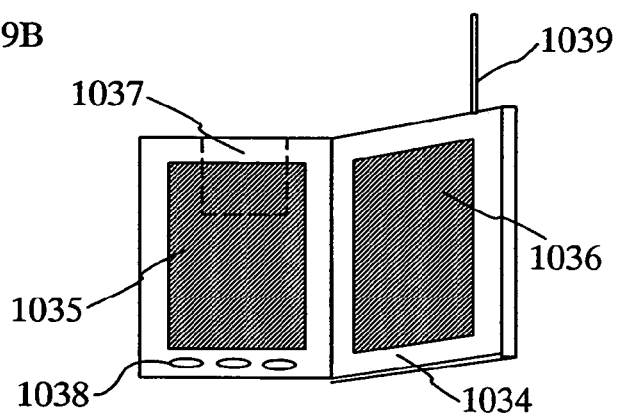

FIG. 9B shows a mobile book (electronic book), comprising a main body 1034, display portions 1035 and 1036, a recording medium 1037, an operating switch 1038, an antenna 1039 and the like. A semiconductor element formed by applying the laser irradiation method of the present invention can be applied to the display portions 1035, 1036. The semiconductor element formed by applying the laser irradiation method of the present invention has less variation, it is possible to provide a stable display quality.

Figure 9C:
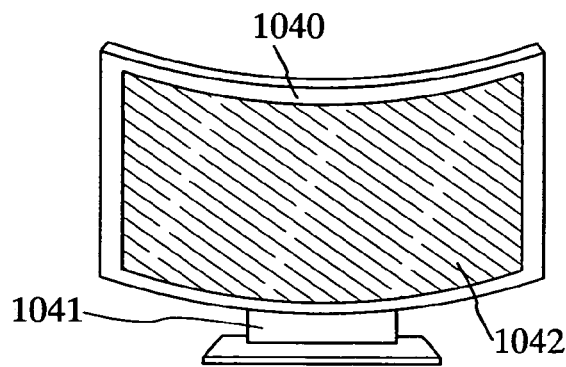

FIG. 9C shows a display, comprising a main body 1040, a supporting stand 1041, a display portion 1042 and the like. The display portion 1042 is manufactured with a flexible substrate, and thereby the light and thin display can be realized. Moreover, it is possible to inflect the display portion 4103. A semiconductor element formed by applying the laser irradiation method of the present invention can be applied to the display portion 1042. The semiconductor element formed by applying the laser irradiation method of the present invention has less variation, it is possible to provide a stable display quality. The present invention is advantageous especially in manufacturing a large-sized display having a length of 10 inch or more (especially more than 30 inch) diagonally.

The present invention can be widely applied to the various kinds of electronic devices. It is noted that these electronic devices described in this embodiment can be combined any of the embodiment mode and the embodiments 1 to 5.

Furthermore, with the miniaturization and the integration of the semiconductor is device in recent years, the semiconductor film to be used in the thin film semiconductor element is becoming thinner and thinner according to the miniaturization of the design rule. In this trend, the interference due to the secondary laser beam that transmits through the semiconductor film and reflects on the rear surface of the substrate is a significant problem. However, the present invention can avoid the interference and manufacture the semiconductor film having more homogeneous crystallinity.

What is claimed is:

1. A method for manufacturing a semiconductor device comprising:

forming an amorphous semiconductor film over a substrate having a refractive index n and a thickness d; and forming a crystal grain grown continuously in a scanning direction by irradiating the amorphous semiconductor film with a laser beam emitted from a pulsed laser oscillator while scanning the substrate in the scanning direction, wherein the laser beam has a pulse width t that satisfies an inequality ct<2nd where c is a speed of light in vacuum.

2. The method according to claim 1, wherein the laser beam emitted from the pulsed laser oscillator is converted into a second harmonic by a non-linear optical element.

3. The method according to claim 1, wherein the amorphous semiconductor film comprises silicon film.

4. The method according to claim 1, wherein the laser beam is incident vertically into the amorphous semiconductor film.

5. The method according to claim 1, wherein the laser beam is incident obliquely into the amorphous semiconductor film.

6. The method according to claim 1, wherein the semiconductor device is incorporated in to an electronic device selected from the group consisting of a personal computer, a video camera, a mobile computer, a goggle type display, a player, a digital camera, a cellular phone, mobile book, and a display.

7. The method according to claim 1, wherein the laser beam has a repetition rate of 10 MHz or more.

8. A method for manufacturing a semiconductor device comprising:
   forming an amorphous semiconductor film over a substrate having a refractive index n and a thickness d; and
   forming a crystal grain grown continuously in a scanning direction by irradiating the amorphous semiconductor film with a laser beam emitted from a pulsed laser oscillator while scanning the substrate in the scanning direction,
   wherein the laser beam has a pulse width t that satisfies an inequality $ct<4nd$ where c is a speed of light in vacuum.

9. The method according to claim 8, wherein the laser beam emitted from the pulsed laser oscillator is converted into a second harmonic by a non-linear optical element.

10. The method according to claim 8, wherein the amorphous semiconductor film comprises silicon film.

11. The method according to claim 8, wherein the laser beam is incident vertically into the amorphous semiconductor film.

12. The method according to claim 8, wherein the laser beam is incident obliquely into the amorphous semiconductor film.

13. The method according to claim 8, wherein the semiconductor device is incorporated in to an electronic device selected from the group consisting of a personal computer, a video camera, a mobile computer, a goggle type display, a player, a digital camera, a cellular phone, mobile book, and a display.

14. The method according to claim 8, wherein the laser beam has a repetition rate of 10 MHz or more.

15. A method for manufacturing a semiconductor device comprising:
   forming an amorphous semiconductor film over a substrate having a refractive index n and a thickness d; and
   forming a crystal grain grown continuously in a scanning direction by irradiating the amorphous semiconductor film with a laser beam emitted from a pulsed laser oscillator while scanning the substrate in the scanning direction,
   wherein one point in the amorphous semiconductor film is irradiated simultaneously with both the laser beam being incident thereinto and the laser beam reflected on a rear surface of the substrate for a time corresponding to 10% or less of a pulse width of the laser beam.

16. The method according to claim 15, wherein the laser beam emitted from the pulsed laser oscillator is converted into a second harmonic by a non-linear optical element.

17. The method according to claim 15, wherein the amorphous semiconductor film comprises silicon film.

18. The method according to claim 15, wherein the laser beam is incident vertically into the amorphous semiconductor film.

19. The method according to claim 15, wherein the laser beam is incident obliquely into the amorphous semiconductor film.

20. The method according to claim 15, wherein the semiconductor device is incorporated in to an electronic device selected from the group consisting of a personal computer, a video camera, a mobile computer, a goggle type display, a player, a digital camera, a cellular phone, mobile book, and a display.

21. The method according to claim 15, wherein the laser beam has a repetition rate of 10 MHz or more.

22. A method for manufacturing a semiconductor device comprising:
   forming a crystal grain grown continuously in a scanning direction by irradiating a crystalline semiconductor film formed over a substrate having a refractive index n and a thickness d with a laser beam emitted from a pulsed laser oscillator while scanning the substrate in the scanning direction so as to improve crystallinity of the crystalline semiconductor film,
   wherein the laser beam has a pulse width t that satisfies an inequality $ct<2nd$ where c is a speed of light in vacuum.

23. The method according to claim 22, wherein the laser beam emitted from the pulsed laser oscillator is converted into a second harmonic by a non-linear optical element.

24. The method according to claim 22, wherein the crystalline semiconductor film comprises silicon film.

25. The method according to claim 22, wherein the laser beam is incident vertically into the crystalline semiconductor film.

26. The method according to claim 22, wherein the laser beam is incident obliquely into the crystalline semiconductor film.

27. The method according to claim 22, wherein the semiconductor device is incorporated in to an electronic device selected from the group consisting of a personal computer, a video camera, a mobile computer, a goggle type display, a player, a digital camera, a cellular phone, mobile book, and a display.

28. The method according to claim 22, wherein the laser beam has a repetition rate of 10 MHz or more.

29. A method for manufacturing a semiconductor device comprising:
   forming a crystal grain grown continuously in a scanning direction by irradiating a crystalline semiconductor film formed over a substrate having a refractive index n and a thickness d with a laser beam emitted from a pulsed laser oscillator while scanning the substrate in the scanning direction so as to improve crystallinity of the crystalline semiconductor film,
   wherein the laser beam has a pulse width t that satisfies an inequality $ct<4nd$ where c is a speed of light in vacuum.

30. The method according to claim 29, wherein the laser beam emitted from the pulsed laser oscillator is converted into a second harmonic by a non-linear optical element.

31. The method according to claim 29, wherein the crystalline semiconductor film comprises silicon film.

32. The method according to claim 29, wherein the laser beam is incident vertically into the crystalline semiconductor film.

33. The method according to claim 29, wherein the laser beam is incident obliquely into the crystalline semiconductor film.

34. The method according to claim 29, wherein the semiconductor device is incorporated in to an electronic device selected from the group consisting of a personal computer, a video camera, a mobile computer, a goggle type display, a player, a digital camera, a cellular phone, mobile book, and a display.

35. The method according to claim 29, wherein the laser beam has a repetition rate of 10 MHz or more.

36. A method for manufacturing a semiconductor device comprising:

forming a crystal grain grown continuously in a scanning direction by irradiating a crystalline semiconductor film formed over a substrate having a refractive index n and a thickness d with a laser beam emitted from a pulsed laser oscillator while scanning the substrate in the scanning direction so as to improve crystallinity of the crystalline semiconductor film, wherein one point in the crystalline semiconductor film is irradiated simultaneously with both the laser beam being incident thereinto and the laser beam reflected on a rear surface of the substrate for a time corresponding to 10% or less of a pulse width of the laser beam.

37. The method according to claim 36, wherein the laser beam emitted from the pulsed laser oscillator is converted into a second harmonic by a non-linear optical element.

38. The method according to claim 36, wherein the crystalline semiconductor film comprises silicon film.

39. The method according to claim 36, wherein the laser beam is incident vertically into the crystalline semiconductor film.

40. The method according to claim 36, wherein the laser beam is incident obliquely into the crystalline semiconductor film.

41. The method according to claim 36, wherein the semiconductor device is incorporated in to an electronic device selected from the group consisting of a personal computer, a video camera, a mobile computer, a goggle type display, a player, a digital camera, a cellular phone, mobile book, and a display.

42. The method according to claim 36, wherein the laser beam has a repetition rate of 10 MHz or more.

* * * * *